(12) United States Patent
Rhee et al.

(10) Patent No.: US 10,511,257 B2
(45) Date of Patent: Dec. 17, 2019

(54) PHOTOVOLTAIC CELL HAVING POLARIZATION CHARACTERISTIC AND ELECTRONIC DEVICE HAVING THE SAME

(71) Applicant: Samsung Electronics Co., Ltd., Gyeonggi-do (KR)

(72) Inventors: Bongjae Rhee, Gyeonggi-do (KR); Sungsoo Moon, Gyeonggi-do (KR); Jihoon Park, Gyeonggi-do (KR); Kemsuk Seo, Gyeonggi-do (KR); Taeyoon An, Gyeonggi-do (KR); Changsu Lee, Gyeonggi-do (KR); Jihun Heo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 133 days.

(21) Appl. No.: 15/609,420

(22) Filed: May 31, 2017

(65) Prior Publication Data

US 2017/0359018 A1 Dec. 14, 2017

(30) Foreign Application Priority Data

Jun. 14, 2016 (KR) .................. 10-2016-0073880

(51) Int. Cl.
*H02S 40/30* (2014.01)
*H01L 31/054* (2014.01)
(Continued)

(52) U.S. Cl.
CPC ............ *H02S 40/30* (2014.12); *H01L 27/301* (2013.01); *H01L 31/02164* (2013.01); *H01L 31/022425* (2013.01); *H01L 31/022466* (2013.01); *H01L 31/042* (2013.01); *H01L 31/054* (2014.12); *H01L 31/075* (2013.01); *H02J 3/383* (2013.01);
(Continued)

(58) Field of Classification Search
CPC . Y02E 10/52; H01L 31/054; H01L 31/02164; H02J 7/35; H02J 3/383; H02S 99/00; H02S 40/42; H02S 40/30
See application file for complete search history.

(56) References Cited

U.S. PATENT DOCUMENTS

2003/0155003 A1* 8/2003 Tur .................. H01L 31/0547
136/246
2011/0109853 A1 5/2011 Ge et al.
(Continued)

FOREIGN PATENT DOCUMENTS

WO WO 2014/072595 5/2014

OTHER PUBLICATIONS

International Search Report dated Jul. 24, 2017 issued in counterpart application No. PCT/KR2017/005223, 4 pages.
(Continued)

*Primary Examiner* — Jared Fureman
*Assistant Examiner* — Duc M Pham
(74) *Attorney, Agent, or Firm* — The Farrell Law Firm, P.C.

(57) ABSTRACT

Disclosed is a photovoltaic cell including a first electrode and a second electrode having transparency and disposed facing each other, and a photovoltaic cell layer disposed between the first and second electrodes, and configured to produce electric energy by absorbing a part of incident light, wherein the photovoltaic cell layer includes a plurality of unit cells disposed in a specific distance from each other and formed with a plurality of slits for polarizing the incident light, and a transparent insulator disposed in the plurality of slits.

20 Claims, 25 Drawing Sheets

(51) Int. Cl.

| | | |
|---|---|---|
| *H02S 40/38* | (2014.01) | |
| *H02S 40/42* | (2014.01) | |
| *H01L 31/0216* | (2014.01) | |
| *H01L 31/0224* | (2006.01) | |
| *H01L 31/042* | (2014.01) | |
| *H01L 31/075* | (2012.01) | |
| *H02J 3/38* | (2006.01) | |
| *H02J 7/00* | (2006.01) | |
| *H02J 7/35* | (2006.01) | |
| *H02S 99/00* | (2014.01) | |
| *H01L 27/30* | (2006.01) | |

(52) U.S. Cl.
CPC ............... *H02J 7/0068* (2013.01); *H02J 7/35* (2013.01); *H02S 40/38* (2014.12); *H02S 40/42* (2014.12); *H02S 99/00* (2013.01); *Y02E 10/52* (2013.01); *Y02E 10/566* (2013.01)

(56) References Cited

U.S. PATENT DOCUMENTS

| | | | |
|---|---|---|---|
| 2011/0203630 A1* | 8/2011 | Takano | ............ H01L 31/03921 136/244 |
| 2012/0070934 A1 | 3/2012 | Mitra et al. | |
| 2012/0194896 A1* | 8/2012 | Kothari | ............... G02F 1/13306 359/290 |
| 2012/0236540 A1 | 9/2012 | Gilbert et al. | |
| 2013/0000690 A1 | 1/2013 | Liu | |
| 2015/0059823 A1* | 3/2015 | Suzuki | ............. H01L 31/02021 136/244 |
| 2015/0364528 A1* | 12/2015 | Xu | ........................ G09F 27/007 257/53 |

OTHER PUBLICATIONS

Kenichiro Hirose et al., Polarization-Transmissive Photovoltaic Film Device Consisting of an Si Photodiode Wire-Grid, !IOP Publishing, XP020138031, Journal of Optics A: Pure and Applied Optics, , vol. 10, No. 4, Apr. 1, 2008, 9 pages.

Imai Y:"Polarizing Element Used for Projector, has Upper and Lower Electrodes of Sub Grid Element that are Connected Electrically to Adjoin Longitudinal Direction of Wire Grid Element", WPI/Thomson, XP002716581, vol. 2012, No. 24, Mar. 15, 2012, 2 pages.

European Search Report dated Apr. 25, 2019 issued in counterpart application No. 17813491.2-1202, 9 pages.

* cited by examiner

PHOTOVOLTAIC CELL HAVING POLARIZATION CHARACTERISTIC AND ELECTRONIC DEVICE HAVING THE SAME

PRIORITY

This application claims priority under 35 U.S.C. § 119(a) to a Korean Patent Application filed in the Korean Intellectual Property Office on Jun. 14, 2016 and assigned Serial No. 10-2016-0073880, the contents of which are incorporated herein by reference.

BACKGROUND

1. Field of the Disclosure

The present disclosure relates generally to an electronic device, and more particularly, to a photovoltaic cell having a polarizing characteristic and an electronic device including the same.

2. Description of the Related Art

According to developments in information, communication and semiconductor technologies, electronic devices such as a smartphone have become everyday necessaries. By installing various applications in a smartphone, users can receive various services such as scheduling, news, and social networking service (SNS)-related services. Accordingly, smartphones tend to stay in daily operation for longer periods of time. However, the hours of battery use as an electric power source are still limited, despite the rise in hours of smartphone use.

Conventional technologies have focused on developing various algorithms and designing electric energy saving circuits in order to extend the hours of smartphone battery use. However, the electric energy accumulated in a battery is fundamentally finite, and the electric energy saving technology is deficient in satisfying the user's requirements.

As such, there is a need in the art for an improvement in the battery life for the smartphone battery, for consistency with the increased time of daily smartphone use.

SUMMARY

The present disclosure has been made to address the above-mentioned shortcomings in the art and to provide the advantages described below.

Accordingly, an aspect of the present disclosure is to provide a photovoltaic cell having a polarizing characteristic and an electronic device including the same.

According to an aspect of the present disclosure, the photovoltaic cell includes a photovoltaic cell including a first electrode and a second electrode having transparency and disposed facing each other, and a photovoltaic cell layer disposed between the first and second electrodes, and configured to produce electric energy by absorbing a part of incident light, wherein the photovoltaic cell layer includes a plurality of unit cells disposed in a specific distance from each other and formed with a plurality of slits for polarizing the incident light, and a transparent insulator disposed in the plurality of slits.

According to another aspect of the present disclosure, an electronic device includes a battery, a display panel, a photovoltaic cell disposed on at least one side of the display panel, a direct current to direct current (DC-DC) converter configured to convert electric energy produced by the photovoltaic cell to a direct current power source, and a charging circuit configured to charge the battery by using the direct current power source converted by the DC-DC converter, wherein the photovoltaic cell includes a first electrode and a second electrode having a transparency and disposed facing each other, and a photovoltaic cell layer disposed between the first and second electrodes, and configured to produce electric energy by absorbing a part of incident light, and wherein the photovoltaic cell layer includes a plurality of unit cells disposed in a specific distance from each other and formed with a plurality of slits for polarizing the incident light, and a transparent insulator disposed in the plurality of slits.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
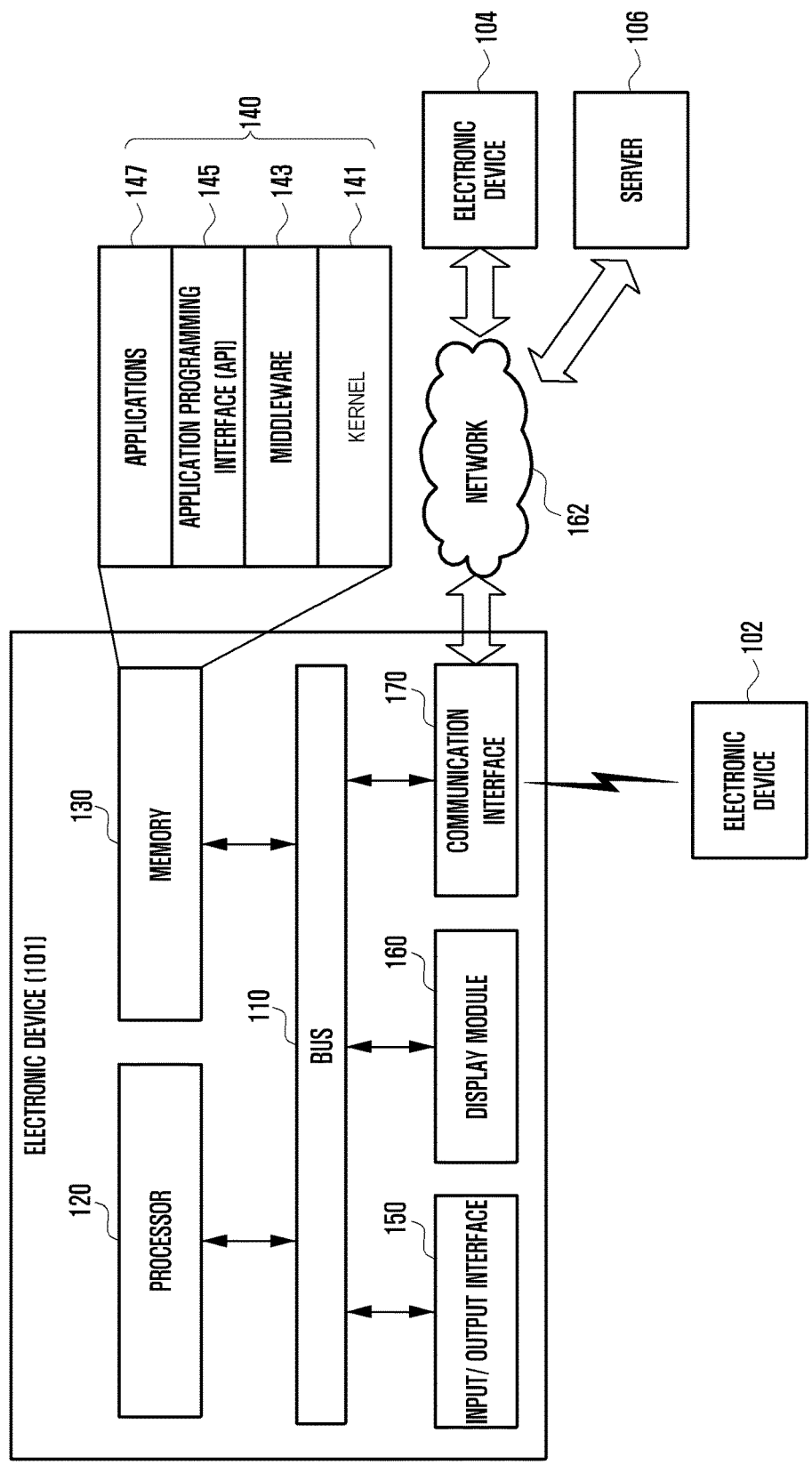
FIG. 1 illustrates an electronic device in a network environment according to embodiments of the present disclosure.

The following description with reference to the accompanying drawings is provided to assist in a comprehensive understanding of embodiments of the present disclosure. It includes specific details to assist in that understanding, but those of ordinary skill in the art will recognize that various changes and modifications of the embodiments described herein can be made without departing from the scope and spirit of the present disclosure. In addition, descriptions of well-known functions and constructions may be omitted for the sake of clarity and conciseness.

The terms and words used in the following description and claims are not limited to their dictionary meanings, but, are merely used to enable a clear and consistent understanding of the present disclosure. Accordingly, it should be apparent to those skilled in the art that the following description of embodiments of the present disclosure is provided for illustrative purposes only and not for the purpose of limiting the present disclosure.

Singular forms "a," "an," and "the" include plural references unless the context clearly dictates otherwise. Thus, reference to "a component surface" includes reference to one or more of such surfaces.

Expressions such as "include" and "may include" may denote the presence of the disclosed functions, operations, and constituent elements and do not limit one or more additional functions, operations, and constituent elements. Terms such as "include" and/or "have" may be construed to denote a certain characteristic, number, operation, constituent element, component or a combination thereof, but may not be construed to exclude the existence or possibility of at least one additional characteristic, number, operation, constituent element, component, or combinations thereof.

In the present disclosure, the expression "and/or" includes any and all combinations of the associated listed words, and thus may include A, B, or both A and B.

Expressions including ordinal numbers, such as "first" and "second" may modify various elements that are not limited by the above expressions. For example, "first" and "second" do not limit the sequence and/or importance of the elements, but are used merely to distinguish an element from the other elements. For example, a first user device and a second user device indicate different user devices although both are user devices. In addition, a first element could be referred to as a second element, and similarly, a second element could be referred to as a first element without departing from the scope of the present disclosure.

When a component, such as a first component, is referred to as being "connected" or "accessed" to another component, such as a second component, it should be understood that the first component may be directly connected or accessed to the second component, or there may exist a third component between the first and second components. However, when a first component is referred to as being "directly connected" or "directly accessed" to a second component, there is no third component therebetween.

As used herein, singular forms are intended to include plural forms as well, unless the context clearly indicates otherwise. An electronic device according to an embodiment of the present disclosure may include a communication function, including but not limited to, a smartphone, a tablet personal computer (PC), a mobile phone, a video phone, an e-book reader, a desktop PC, a laptop PC, a netbook computer, a personal digital assistant (PDA), a portable multimedia player (PMP), a digital audio player, a mobile medical device, an electronic bracelet, an electronic necklace, an electronic accessory, a camera, a wearable device, an electronic clock, a wrist watch, home appliances including an air-conditioner, vacuum, oven, microwave oven, washing machine, and air cleaner, an artificial intelligence robot, a television (TV), digital video disk (DVD) player, an audio device, various medical devices including magnetic resonance angiography (MRA), magnetic resonance imaging (MRI), computed tomography (CT), a scanning machine, an ultrasonic wave device, a navigation device, a global positioning system (GPS) receiver, an event data recorder (EDR), a flight data recorder (FDR), a set-top box, a TV box, such as Samsung HomeSync™, Apple TV™, or Google TV™, an electronic dictionary, vehicle infotainment device, electronic equipment for a ship, such as a navigation device or a gyrocompass, avionics, a security device, electronic clothes, an electronic key, a camcorder, game consoles, a head-mounted display (HMD), a flat panel display device, an electronic frame, an electronic album, furniture or a portion of a building/structure that includes a communication function, an electronic board, an electronic signature receiving device, or a projector.

FIG. 1 illustrates a configuration of an electronic device according to an embodiment of the present disclosure. Referring to FIG. 1, the electronic device 101 includes a bus 110, a processor 120, a memory 130, an input/output interface 150, a display module 160, and a communication interface 170. The electronic device 101 may also include other similar and/or suitable components.

The bus 110 may be a circuit which interconnects and delivers a communication between the above-described elements.

The processor 120 may receive commands from the above-described other elements through the bus 110, may interpret the received commands, and may execute calculation or data processing according to the interpreted commands.

The memory 130 may store commands or data received from the processor 120 or other elements or generated by the processor 120 or the other elements and includes programming modules 140, such as a kernel 141, middleware 143, an application programming interface (API) 145, and applications 147. Each of the above-described programming modules may be implemented in software, firmware, hardware, or a combination of two or more thereof.

The kernel 141 may control or manage system resources, such as the bus 110, the processor 120, and the memory 130, used to execute operations or functions implemented by other programming modules, such as the middleware 143, the API 145, and the applications 147, and may provide an interface capable of accessing and controlling or managing the individual elements of the electronic device 101 by using the middleware 143, the API 145, or the applications 147.

The middleware 143 may communicate between the API 145 or the applications 147 and the kernel 141 in such a manner that the API 145 or the applications 147 communicates and exchanges data with the kernel 141. The middleware 143 may perform load balancing of the work requests received from one or more applications 147 by using a method of assigning a priority, in which system resources of the electronic device 101 can be used, to at least one of the one or more applications 147.

The API 145 is an interface through which the applications 147 are capable of controlling a function provided by the kernel 141 or the middleware 143, and may include at least one interface or function for file control, window control, image processing, or character control.

The input/output interface 150 may receive a command or data as input from a user, and may deliver the received command or data to the processor 120 or the memory 130 through the bus 110. The display module 160 may display a video, an image, or data to the user.

The communication interface 170 may connect communication between another electronic device 102 and the electronic device 101, and may support a predetermined short-range communication protocol, such as Wi-Fi, Bluetooth® (BT), and near field communication (NFC), or predetermined network communication 162 including the Internet, a local area network (LAN), a wide area network (WAN), a telecommunication network, a cellular network, a satellite network, and a plain old telephone service (POTS). Each of the electronic devices 102 and 104 may be identical to or different from the electronic device 101, in terms of type. The communication interface 170 may connect communication between a server 106 and the electronic device 101 via the network 162.

Figure 2:
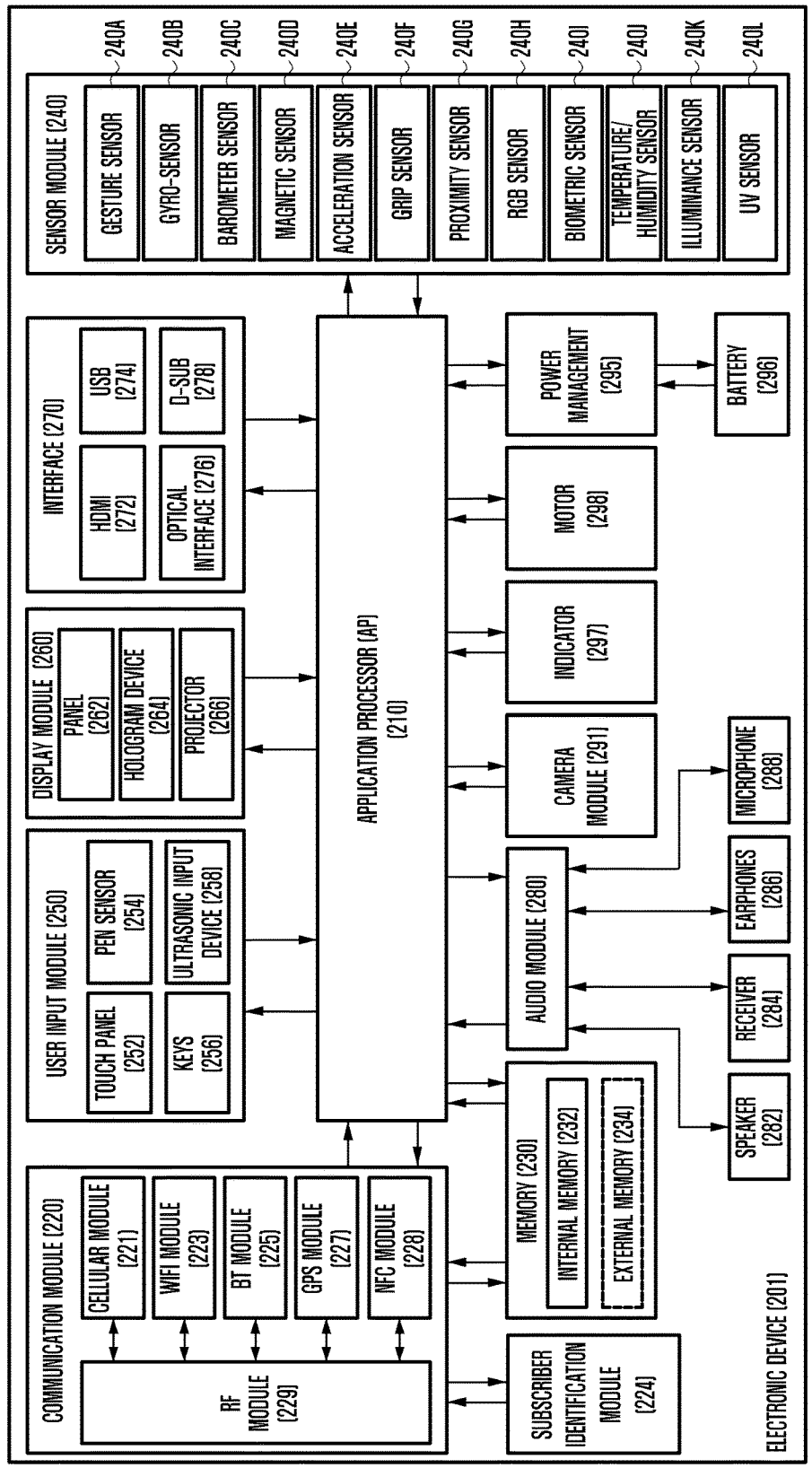
FIG. 2 illustrates a configuration of an electronic device according to embodiments of the present disclosure.

FIG. 2 illustrates a configuration of an electronic device 201 according to an embodiment of the present disclosure.

The electronic device 201 may be hardware.

Referring to FIG. 2, the electronic device 201 includes one or more application processors (APs) 210, a communication module 220, a subscriber identification module (SIM) card 224, a memory 230, a sensor module 240, a user input module 250, a display module 260, an interface 270, an audio module 280, a camera module 291, a power management module 295, a battery 296, an indicator 297, and a motor 298. The electronic device 201 may also include any other similar and/or suitable components.

The application processor (AP) 210 may include one or more APs or communication processors (CPs). The AP 210 is illustrated as being included in the processor 210 in FIG. 2, but may be included in different integrated circuit (IC) packages, respectively, or in one IC package.

The AP 210 may execute an operating system (OS) or an application program, and thereby may control multiple hardware or software elements connected to the AP 210 and perform processing of and arithmetic operations on various data including multimedia data. The AP 210 may be implemented by a system on chip (SoC) and may further include a graphical processing unit (GPU).

The AP 210 may manage a data line and may convert a communication protocol in the case of communication between the electronic device including the electronic device 201 and different electronic devices connected to the electronic device through the network, and may perform at least two of multimedia control functions, such as distinguishing and authenticating a terminal in a communication network by using the SIM card 224. The AP 210 may provide the user with services, such as a voice telephony call, a video telephony call, a text message, and packet data.

The AP 210 may control the transmission and reception of data by the communication module 220. In FIG. 2, the elements such as the AP 210, the power management module 295, and the memory 230 are illustrated separately from the AP 210, but the AP 210 may include at least two of the above-described elements.

The AP 210 may load, to a volatile memory, a command or data received from at least one of a non-volatile memory and other elements connected to each AP 210, may process the loaded command or data, and may store, in a non-volatile memory, data received from or generated by at least one of the other elements.

The SIM card 224 may implement a subscriber identification module, may be inserted into a slot formed in a particular portion of the electronic device 100, and may include unique identification information such as an integrated circuit card identifier (ICCID) or subscriber information such as international mobile subscriber identity (IMSI).

The memory 230 includes an internal memory 232 and an external memory 234. The internal memory 232 may include at least one of a volatile memory including a dynamic random access memory (DRAM), a static RAM (SRAM), a synchronous dynamic RAM (SDRAM), etc.), and a non-volatile memory including a one-time programmable read only memory (OTPROM), a programmable ROM (PROM), an erasable and programmable ROM (EPROM), an electrically erasable and programmable ROM (EEPROM), a mask ROM, a flash ROM, a Not AND (NAND) flash memory, and a Not OR (NOR) flash memory. The internal memory 232 may be in the form of a solid state drive (SSD). The external memory 234 may further include a flash drive, including a compact flash (CF), a secure digital (SD) card, a micro-secure digital (Micro-SD) card, a mini-secure digital (Mini-SD) card, an extreme digital (xD) card, and a memory stick.

The communication module 220 may include a cellular module 221, a Wi-Fi module 223, a Bluetooth (BT) module 225, a GPS module 227, an NFC module 228 and a radio frequency (RF) module 229. For example, the wireless communication module 220 may provide a wireless communication function by using a radio frequency, and may include a network interface including a local area network (LAN) card or a modulator/demodulator (modem) for connecting the electronic device 201 to a network.

The RF module 229 may be used for transmission and reception of RF signals or called electronic signals and may include a transceiver, a power amplifier module (PAM), a frequency filter, a low noise amplifier (LNA), and a component for transmitting and receiving electromagnetic waves in a free space in a wireless communication, such as a conductor or a conductive wire.

The sensor module 240 includes at least one of a gesture sensor 240A, a gyro sensor 240B, an barometer sensor 240C, a magnetic sensor 240D, an acceleration sensor 240E, a grip sensor 240F, a proximity sensor 240G, a red, green, blue (RGB) sensor 240H, a biometric sensor 240I, a temperature/humidity sensor 240J, an illuminance sensor 240K, and an ultra violet (UV) sensor 240L. The sensor module 240 may measure a physical quantity or may sense an operating state of the electronic device 201, and may convert the measured or sensed information to an electrical signal. Additionally/alternatively, the sensor module 240 may include an e-nose sensor, an electromyography (EMG) sensor, an electroencephalogram (EEG) sensor, an electrocardiogram (ECG) sensor, a fingerprint sensor, and a control circuit for controlling one or more sensors included therein.

The user input module 250 includes a touch panel 252, a digital pen sensor 254, keys 256, and an ultrasonic input device 258. The touch panel 252 may recognize a touch input in at least one of a capacitive, resistive, infrared, and acoustic wave scheme, and may further include a controller. In the capacitive type, the touch panel 252 is capable of recognizing proximity as well as a direct touch. The touch panel 252 may further include a tactile layer that provides a tactile response to the user.

The pen sensor 254 may be implemented by using a method identical or similar to a method of receiving a touch input from the user, or by using a separate sheet for recognition. For example, a key pad or a touch key may be used as the keys 256. The ultrasonic input device 258 enables the terminal to sense a sound wave by using a microphone 288 of the terminal through a pen generating an ultrasonic signal, and to identify data, and is capable of wireless recognition. The electronic device 201 may receive a user input from an external device, such as a network, a computer, or a server, which is connected to the communication module 230, through the communication module 230.

The display module 260 includes a panel 262, a hologram device 264, and projector 266. The panel 262 may be, a liquid crystal display (LCD) or an active matrix organic light emitting diode (AM-OLED) display, may be implemented so as to be flexible, transparent, or wearable, and may include the touch panel 252 and one module. The hologram device 264 may display a three-dimensional image in the air by using interference of light. The display module 260 may further include a control circuit for controlling the panel 262 or the hologram device 264.

The interface 270 may include a high-definition multimedia interface (HDMI) 272, a universal serial bus (USB) 274, an optical interface 276, and a d-subminiature (D-sub) 278, and may also include a secure digital (SD)/multi-media card (MMC) or infrared data association (IrDA) interface.

The audio module 280 may bi-directionally convert between a voice and an electrical signal, and may convert voice information, which is input to or output from the audio module 280, through a speaker 282, a receiver 284, earphones 286, or the microphone 288, for example.

The camera module 291 may capture an image and a moving image, and may include one or more image sensors, such as a front lens or a back lens, an image signal processor (ISP), and a flash light-emitting diode (LED).

The power management module 295 may manage power of the electronic device 201 and may include a power management integrated circuit (PMIC), a charger integrated circuit (IC), and a battery gauge.

The PMIC may be mounted to an IC or an SoC semiconductor. Charging methods may be classified into a wired and a wireless charging method. The charger IC may charge a battery, and may prevent an overvoltage or an overcurrent from charger to battery. The charger IC may include a charger IC for at least one of the wired and the wireless charging methods, such as magnetic resonance, magnetic induction, or electromagnetic methods. Additional circuits including a coil loop, a resonance circuit, or a rectifier for wireless charging may be added in order to perform the wireless charging.

The battery gauge may measure a residual quantity of the battery 296, or a voltage, a current or a temperature during the charging. The battery 296 may supply power by generating electricity, and may be a rechargeable battery.

The indicator 297 may indicate particular states or a part of the electronic device 201, such as a booting, message, or charging state. The motor 298 may convert an electrical signal into a mechanical vibration. The AP 210 may control the sensor module 240.

The electronic device 201 may include a processing unit, such as a GPU, for supporting a module TV by processing media data according to standards such as digital multimedia broadcasting (DMB), digital video broadcasting (DVB), and media flow. Each of the above-described elements of the electronic device 201 may include one or more components, and the name of the relevant element may change depending on the type of electronic device. The electronic device 201 may include at least one of the above-described elements. Some of the above-described elements may be omitted from the electronic device 201, or the electronic device 201 may further include additional elements that may be combined into one entity, which may perform functions identical to those of the relevant elements before the combination.

The term "module" used in the present disclosure may refer to a unit including one or more combinations of hardware, software, and firmware, may be interchangeably used with terms such as "unit," "logic," "logical block," "component," or "circuit", may be a minimum unit of a component formed as one body or a part thereof, may be a minimum unit for performing one or more functions or a part thereof, and may be implemented mechanically or electronically. For example, the "module" according to an embodiment of the present disclosure may include at least one of an application-specific integrated circuit (ASIC) chip, a field-programmable gate array (FPGA), and a programmable-logic device for performing certain operations which have been known or are to be developed in the future.

Figure 3:
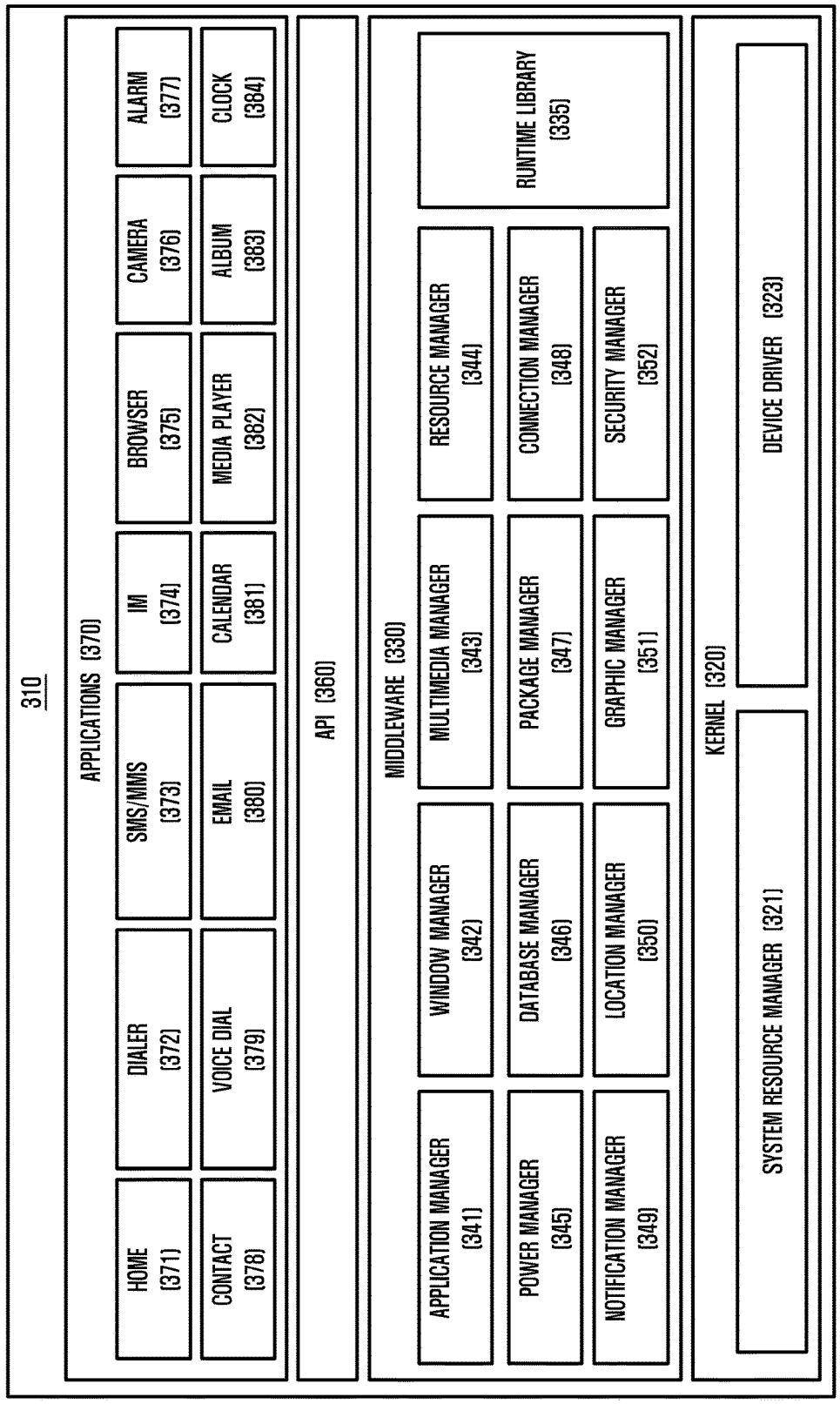
FIG. 3 illustrates a configuration of a program module according to embodiments of the present disclosure.

FIG. 3 illustrates a configuration of a programming module 310 according to an embodiment of the present disclosure.

The programming module 310 may be included (or stored) in the electronic device 101 or may be included (or stored) in the electronic device 201 illustrated in FIG. 1. At least a part of the programming module 310 may be implemented in software, firmware, hardware, or a combination of two or more thereof. The programming module 310 may include an OS controlling resources related to an electronic device and/or various applications 370 executed in the OS. For example, the OS may be Android, iOS, Windows, Symbian, Tizen, or Bada.

Referring to FIG. 3, the programming module 310 includes a kernel 320, a middleware 330, an API 360, and the applications 370.

The kernel 320 includes a system resource manager 321 and a device driver 323. The system resource manager 321 may include a process manager, a memory manager, and a file system manager, and may perform the control, allocation, or recovery of system resources. The device driver 323 may include a display driver, a camera driver, a Bluetooth driver, a shared memory driver, a USB driver, a keypad driver, a Wi-Fi driver, and/or an audio driver, and may further include an inter-process communication (IPC) driver.

The middleware 330 may include multiple modules previously implemented so as to provide a function used in common by the applications 370, and may provide a function to the applications 370 through the API 360 in order to enable the applications 370 to efficiently use limited system resources within the electronic device. For example, as illustrated in FIG. 3, the middleware 330 includes a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352. The middleware 330 may also include any other suitable and/or similar manager.

The runtime library 335 may include a library module used by a complier, in order to add a new function by using a programming language during the execution of the applications 370, and may perform functions which are related to input and output, the management of a memory, or an arithmetic function, for example.

The application manager 341 may manage a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory and/or a storage space of at least one of the applications 370.

The power manager 345 may operate together with a basic input/output system (BIOS), may manage a battery or power, and may provide power information and other information used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as Wi-Fi and Bluetooth. The notification manager 349 may display or report, to the user, an event such as an arrival message, an appointment, or a proximity alarm in a manner that does not disturb the user. The location manager 350 may manage location information of the electronic device. The graphic manager 351 may manage a graphic effect, which is to be provided to the user, and/or a user interface related to the graphic effect. The security manager 352 may provide various security functions used for system security and user authentication. When the electronic device has a telephone function, the middleware 330 may further include a telephony manager for managing a voice telephony call function and/or a video telephony call function of the electronic device.

The middleware 330 may generate and use a new middleware module through various functional combinations of the above-described internal element modules, may provide modules specialized according to types of OSs in order to provide differentiated functions, and may dynamically delete some of the existing elements or add new elements. Accordingly, the middleware 330 may omit some of the elements described in the embodiments of the present disclosure, may further include other elements, or may replace the some of the elements with elements that perform a similar function but have a different name.

The API 360 is a set of API programming functions, and may be provided with a different configuration according to an OS. In the case of Android or iOS, one API set may be provided to each platform. In the case of Tizen, two or more API sets may be provided to each platform.

The applications 370 may include a preloaded application and/or a third party application, and may include home 371, dialer 372, short message service/multimedia messaging service (SMS/MMS) 373, instant message (IM) 374, browser 375, camera 376, alarm 377, contact 378, voice dial 379, electronic mail (e-mail) 380, calendar 381, media player 382, album 383, and clock 384 applications, and any of other suitable and/or similar applications.

At least a part of the programming module 310 may be implemented by instructions stored in a non-transitory computer-readable storage medium. When the instructions are executed by one or more processors, the one or more processors may perform functions corresponding to the instructions. The non-transitory computer-readable storage medium may be the memory 230. At least a part of the programming module 310 may be executed by the one or more APs 210. At least a part of the programming module 310 may include a module, a program, a routine, a set of instructions, and/or a process for performing one or more functions.

Names of the elements of the programming module 310 according to an embodiment of the present disclosure may change depending on the type of OS. The programming module according to an embodiment of the present disclosure may include one or more of the above-described elements. Some of the above-described elements may be omitted from the programming module, and additional elements may be included in the programming module. The operations performed by the programming module or other elements may be processed in a sequential, parallel, repetitive, or heuristic method. Also, some of the operations may be omitted, or other operations may be added to the operations.

An electronic device according to embodiments of the present disclosure may include a display panel, and a photovoltaic cell disposed at a side of the display panel. The electronic device may further include a battery, a direct current-direct current (DC-DC) converter for converting an electromotive force generated by the photovoltaic cell to a specific voltage level, and a charging circuit for charging the battery by using the voltage converted by the DC-DC converter. At least one part of the photovoltaic cell can be connected to an electrostatic protection circuit, to ground, or to a heat dissipation sheet or a heat sink. The display panel may be configured with an organic LED (OLED) panel or an LCD panel.

The photovoltaic cells according to embodiments of the present disclosure are disposed facing each other between a first electrode and a second electrode having a transparency. The photovoltaic cell may include a photovoltaic cell layer for producing electric energy by absorbing a part of an incident light. The photovoltaic cell layers are arranged in a specific distance and may include a plurality of slits for polarizing the incident light and a transparent insulator disposed in the plurality of slits. The photovoltaic cell layer is configured to absorb light vibrating in a first direction and to pass light vibrating in a second direction perpendicular to the first direction, and a plurality of unit cells can generate an electromotive force by absorbing the light vibrating in the first direction.

Each of the plurality of unit cells may include a semiconductor layer configured with at least one p-type semiconductor and at least one n-type semiconductor, an intrinsic semiconductor between the at least one p-type semiconductor and the at least one n-type semiconductor, a light shielding layer disposed on the second electrode, and a metal layer disposed between the semiconductor layer and the light shielding layer. The plurality of unit cells may further include a plurality of first unit cells configured with the semiconductor layer, the semiconductor layer, and the metal layer; and the number of the plurality of first unit cells may be greater than or equal to the number of the plurality of second unit cells.

At least two of the first unit cells may be disposed between adjacent second unit cells. Each of the plurality of unit cells may include a first semiconductor layer connected to the first electrode and including at least one p-type semiconductor and at least one n-type semiconductor, a second semiconductor layer connected to the second electrode, and including at least one p-type semiconductor and at least one n-type semiconductor, and a metal layer disposed between the first and second semiconductor layers. The metal layers included in the plurality of unit cells can be connected at a boundary area of the first and second electrodes and can be electrically floated. The photovoltaic cell may further include a phase delay layer configured to delay a phase of light polarized by the photovoltaic cell layer.

Figure 4:
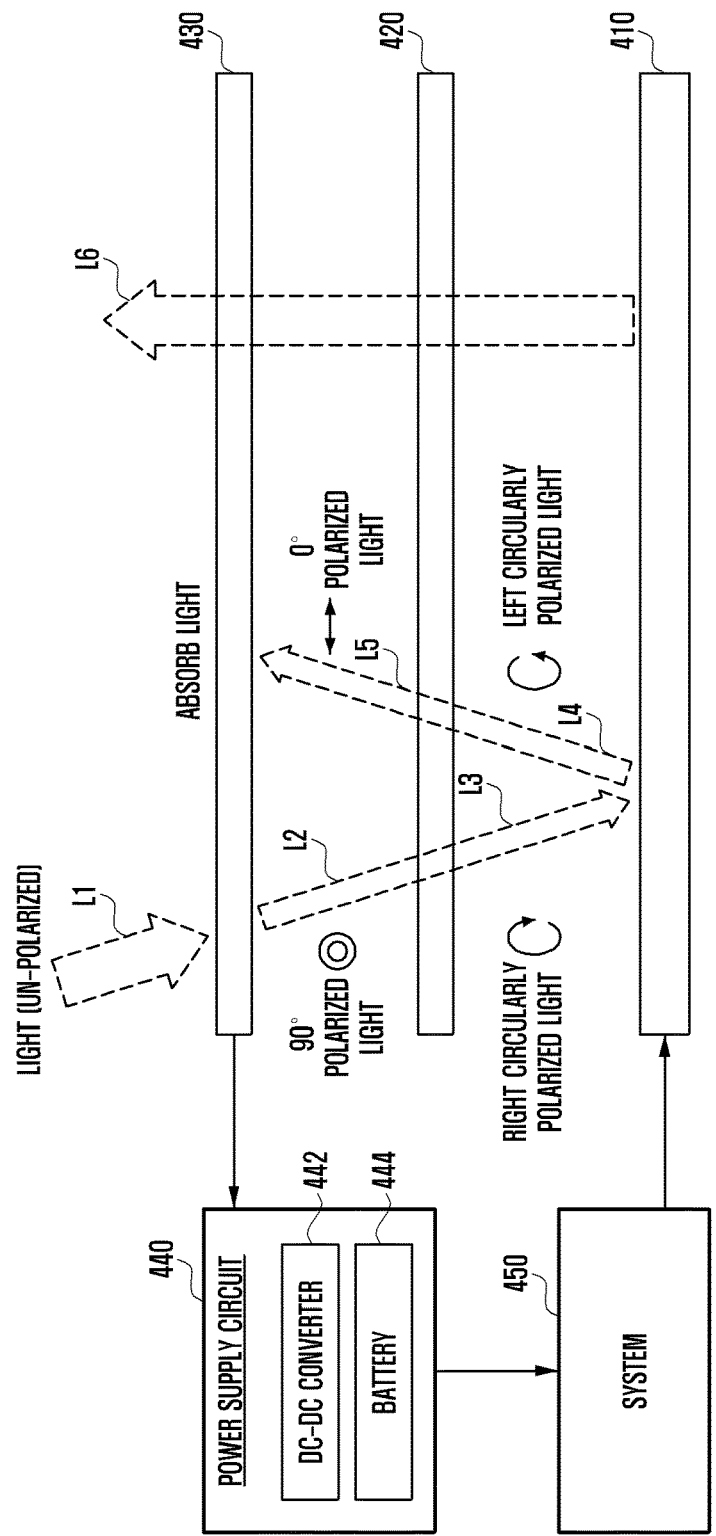
FIG. 4 illustrates a configuration of an electronic device according to an embodiment of the present disclosure.

FIG. 4 illustrates a configuration of an electronic device according to an embodiment of the present disclosure.

In FIG. 4, the electronic device may include a display panel 410 and a photovoltaic cell 430.

The display panel 410 may be configured with an LCD, a field emission display (FED), a plasma display panel (PDP), an OLED, or an electrophoresis display (EPD).

According to embodiments, the display panel 410 shown in FIG. 4 is configured with an OLED panel. For example, the display panel 410 may include a first electrode and a second electrode facing each other, and an organic light emitting layer disposed between the first and second electrodes. The organic light emitting layer may include a hole injection layer (HIL), a hole transport layer (HTL), an emission layer (EML), an electron transport layer (ETL), and an electron injection layer (EIL).

The display panel 410 can drive in the following manner: If positive (+) and negative (−) voltages are engaged respectively to an anode electrode and a cathode electrode, a hole inserted into the HIL is transported to a light emitting layer through the HTL, and an electron inserted into the EIL is transported to the light emitting layer through the ETL. The hole and electron transported to the light emitting layer generates an exciton by combining each other, and the exciton generates light by transiting from an excited state to a ground state. The light can be output to a side, such as to an upper direction of the display panel 410, which can display an image by changing the brightness (gradation) or color of the light.

A photovoltaic cell 430 can be disposed at a side of the display panel 410, such as on a front surface or upper part of the display panel 410. The photovoltaic cell 430 can produce electric energy by using an incident light and polarize the incident light. For example, the photovoltaic cell 430 can generate electric energy by using the incident light and acting as a polarizer.

According to embodiments, the photovoltaic cell 430 can act as a polarizing film (polarizing board or polarizing sheet) generally attached to a front surface of an OLED panel, which can improve an outdoor visibility and a black gradation. The function and role of the polarizing film attached to the front surface of the OLED panel correspond to the prior art, and thus a detailed description is omitted here.

According to embodiments, the polarizing film attached to the front surface of the display panel 410 (OLED panel) in the electronic device can be omitted from the electronic device and the photovoltaic cell 430 can be disposed at the front surface of the display panel 410 instead of the polarizing film.

If the electronic device is used in an indoor environment, the photovoltaic cell 430 can convert artificial light generated by indoor illumination to electric energy and charge a battery 444. Alternatively, if the electronic device is used in an outdoor environment, the photovoltaic cell 430 can convert the sunlight or light generated by outdoor illumination to electric energy and charge the battery 444.

For example, the photovoltaic cell 430 can convert the sunlight to electric energy, can convert artificial light generated by outdoor or indoor illumination as well as the sunlight to electric energy, and can produce the electric energy from external light or light (image) output by the display panel 410. For example, the photovoltaic cell 430 can produce the electric energy from external light illuminating the electronic device, such as sunlight.

The electronic device according to embodiments of the present disclosure can replace the polarizing film configured in the electronic device with the photovoltaic cell 430, and produce electric energy from external light and charge the battery 444 by using the produced electric energy. Accordingly, the electronic device can extend the hours of use for the battery 444 and the electronic device.

For reference, it is well known that the transmissivity of polarizing film generally attached to an OLED panel is about 45%, and light absorbed by the polarizing film dissipates in a heat energy form. The electronic device according to embodiments can reduce heat generation because the photovoltaic cell 430 converts heat energy generated in the process of polarizing light to electric energy.

In FIG. 4, the electronic device according to embodiments may further include a phase delay layer 420 (phase delay film), power supply circuit 440, and system 450.

The phase delay layer 420 may be disposed between the photovoltaic cell 430 and the display panel 410, may be attached at a rear surface such as a lower part of the photovoltaic cell 430, delays a phase of incident light, and may be configured with a phase delay film or a phase difference film, such as a $\lambda/4$ phase difference film.

The $\lambda/4$ phase difference film can convert linearly polarized light to circularly polarized light or circularly polarized light to linearly polarized light by applying a phase difference of $\lambda/4$ to 2 polarizing components perpendicular to each other. The light passed by the phase delay layer 420 can be polarized in a clockwise direction or a counter-clockwise direction. For example, the light polarized in the clockwise direction may be defined as right circularly polarized light, and the light polarized in the counter-clockwise direction may be defined as left circularly polarized light. According to an embodiment, the phase delay layer 420 can be configured with a half wave plate (HWP).

The power supply circuit 440 may include a DC-DC converter 442 and a battery 444.

The DC-DC converter 442 stably supplies direct current power, and receives and outputs direct current power having a specific value. According to an embodiment, the DC-DC converter 442 can be driven in a voltage control method which can adjust direct current output by varying a duty ratio of a pulse width modulation signal according to a load variation.

According to embodiments, if electric energy is produced by the photovoltaic cell 430, the DC-DC converter 442 can generate direct current power having a specific value by using the electric energy produced by the photovoltaic cell 430, and charge the battery 444 by supplying the generated direct current power to the battery 444. According to another embodiment, the DC-DC converter 442 can generate direct current power by using the electric energy produced by the photovoltaic cell 430, and directly supply the generated direct current power to the system 450.

The battery 444 can store the electric energy and supply the stored electric energy to components configured in the electronic device by connecting to a charging IC or a DC-DC converter 442.

The system 450 includes a processor 210, controls a plurality of hardware and software components included in the electronic device, and performs data processing and calculation. For example, the system 450 can drive the display panel 410.

Hereinafter, operations of the photovoltaic cell 430 acting as a polarizer will be described.

Incident light L1 received from the outside can be transmitted to a front surface of the photovoltaic cell 430. The incident light L1 may be the sunlight or light emitted by an external illumination, may be in an un-polarized state, and may be converted to linearly polarized light L2 by passing the photovoltaic cell 430. For example, the photovoltaic cell 430 can absorb light vibrating in a first direction from the incident light and pass light vibrating in a second direction perpendicular to the first direction. For example, the light vibrating in the first direction may have an X-axis vector component, and the light vibrating in the second direction may have a Y-axis vector component. According to an embodiment, the light vibrating in the first direction may vibrate in a 0° direction, and the light vibrating in the second direction vibrate in a 90° direction. Accordingly, the light which passed the photovoltaic cell 430 can be converted to the light L2 vibrating in the second direction, which is linearly polarized light vibrating in the 90° direction.

The light absorbed by the photovoltaic cell 430 from the incident light L1 can be converted to electric energy. The photovoltaic cell 430 can charge the battery 444 by supplying the converted electric energy to the power supply circuit 440.

The light L2 linearly polarized by passing the photovoltaic cell 430 can be converted to circularly polarized light L3 by passing the phase delay layer 420. For example, the phase delay layer 420 can convert the light vibrating in the second direction (i.e., linearly polarized light L2 vibrating in the 90° direction) to right circularly polarized light L3.

The right circularly polarized light L3 converted by passing the phase delay layer 420 is reflected by a metallic material included in the display panel 410 (i.e., cathode of an OLED panel), and the rotating direction of the circularly polarized light L3 can be reversed in the process of reflecting. For example, the cathode included in the display panel 410 reflects the right circularly polarized light passed through the phase delay layer 420, and the reflected light becomes left circularly polarized light L4.

The right circularly polarized light L4 reflected in the display panel 410 can be converted to linearly polarized light L5 by passing the phase delay layer 420. For example, the phase delay layer 420 can convert the right circularly polarized light L4 to the light vibrating in the first direction (i.e., linearly polarized light L5 vibrating in the 0° direction).

The linearly polarized light L5 converted by passing the phase delay layer 420 enters the rear surface of the photovoltaic cell 430, but cannot pass the photovoltaic cell 430 and can be absorbed by the photovoltaic cell 430. For example, the linearly polarized light L5 entering the photovoltaic cell 430 in the first direction cannot pass the photovoltaic cell 430 and can be absorbed by the photovoltaic cell 430, because the linearly polarized light L5 converted by passing the phase delay layer 420 can vibrate in the first direction (i.e., 0° direction), and the photovoltaic cell 430 has a characteristic of absorbing the light vibrating in the first direction and passing the light vibrating in the second direction perpendicular to the first direction.

The linearly polarized light L5 passing the phase delay layer 420 and absorbed by the photovoltaic cell 430 can be converted to electric energy by the photovoltaic cell 430, which charges the battery 444 by supplying the converted electric energy to the power supply circuit 440.

The display panel 410 can output an image under the control of the system 450. The image (i.e., light) output by the display panel 410 passes the phase delay layer 420, enters the rear surface of the photovoltaic cell 430, and can be converted to linearly polarized light by passing the photovoltaic cell 430. For example, the photovoltaic cell 430 can absorb light received from the outside and vibrating in the first direction, and pass light vibrating in the second direction perpendicular to the first direction.

The light absorbed by the photovoltaic cell 430 from light output by the display panel 410 can be converted to electric energy by the photovoltaic cell 430. The photovoltaic cell 430 can charge the battery 444 by supplying the converted energy to the power supply circuit 440.

Figure 5:
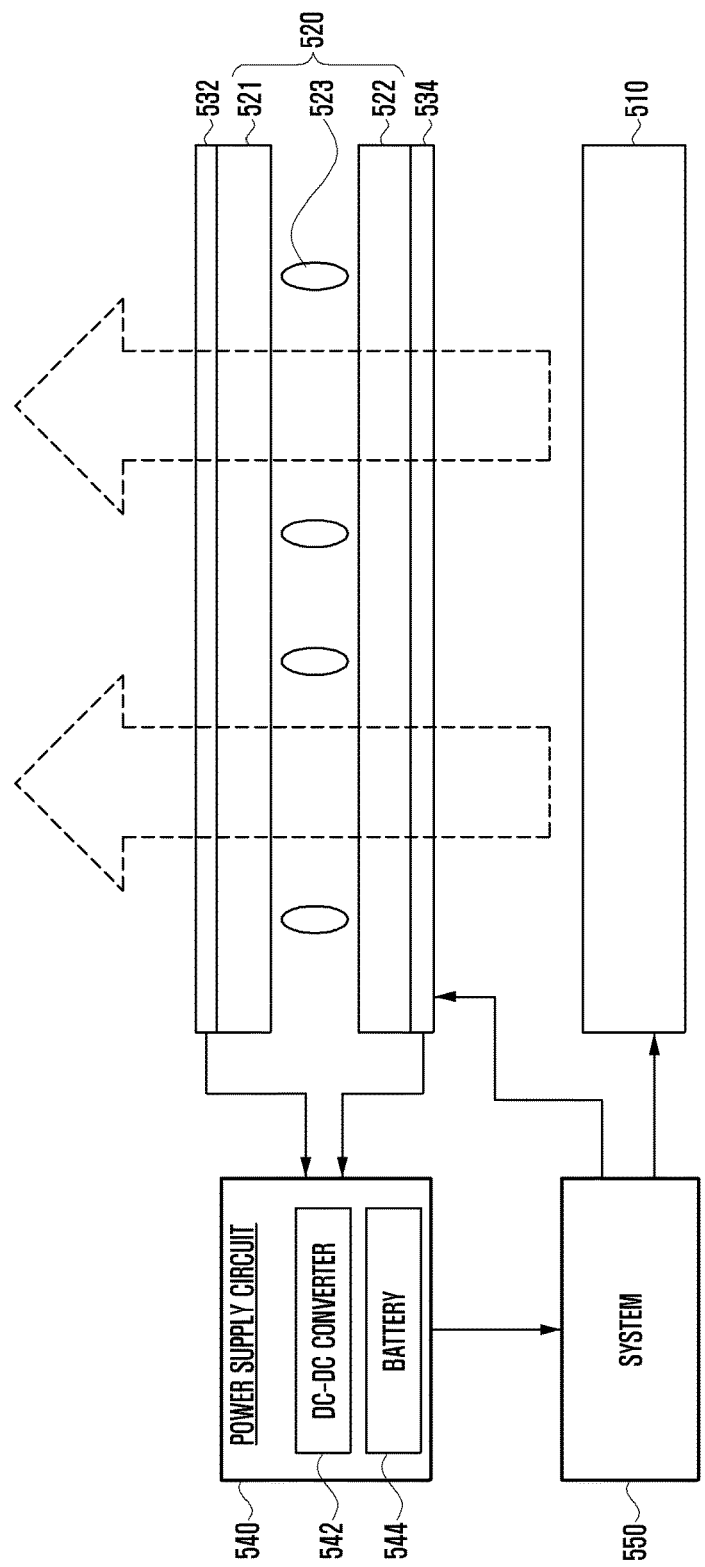
FIG. 5 illustrates a configuration of an electronic device according to another embodiment of the present disclosure.

FIG. 5 illustrates a configuration of an electronic device according to another embodiment of the present disclosure.

In FIG. 5, the electronic device may include a display panel 520, backlight unit 510, and photovoltaic cells 532 and 534.

Differently from the electronic device shown in FIG. 4, the electronic device shown in FIG. 5 may be configured with an LCD display panel 520, and may further include a backlight unit 510.

The display panel 520 configured with an LCD may include an upper substrate 521, a lower substrate 522, and a liquid crystal layer 523 disposed between the upper substrate 521 and the lower substrate 522.

The display panel 520 configured with an LCD can display an image by adjusting a light penetration ratio of a liquid crystal having a dielectric anisotropy in an electric field, can control a degradation by adjusting penetration of light emitted by the backlight unit 510, and can display a color image by converting the light emitted by the backlight unit 510 to red, green, and blue light with a color filter.

The display panel 520 may include liquid crystal cells disposed in a matrix form according to a structure of intersecting data lines and gate lines. The lower substrate 522 may be configured with a pixel array including data lines, gate lines, thin film transistors (TFTs), pixel electrodes, and storage capacitors. The liquid crystal cells can be driven by an electric field formed between the pixel electrodes and common electrodes connected to the TFT.

A black matrix, color filter, and common electrode may be formed in the upper substrate 521. Photovoltaic cells 532 and 534 may be disposed at a front surface of the upper substrate 521 and at a rear surface of the lower substrate 522. For example, a first photovoltaic cell 532 may be disposed at the front surface of the upper substrate 521, and a second photovoltaic cell 534 may be disposed at the rear surface of the lower substrate 522. According to embodiments, the display panel 520 can be configured in a vertical or a horizontal electric field drive method. The common electrode can be formed on the upper substrate 521 in the vertical electric field drive method such as a twisted nematic (TN) mode and a vertical alignment (VA) mode. Alternatively, in the method of driving a liquid crystal layer, the common electrode can be formed on the lower substrate 522 with a pixel electrode in the horizontal electric field drive method, such as an in plane switching (IPS) mode and a fringe field switching (FFS) mode.

The first and second photovoltaic cells 532 and 534 may be identical or similar to the photovoltaic cell 430 of FIG. 4.

The first and second photovoltaic cells 532 and 534 can convert sunlight to electric energy, can convert an artificial light such as outdoor illumination and indoor illumination and sunlight to electric energy, and can absorb a part of light output by the backlight unit 510 and convert the output light to electric energy. According to embodiments, the first and second photovoltaic cells 532 and 534 can generate electric energy by using incident light and polarize the incident light in the manner of a polarizer.

For reference, a polarizing film is generally attached on upper and lower parts of an LCD panel, and the first and second photovoltaic cells 532 and 534 can act as the polarizing film by including absorbing axes intersecting each other. For example, the first photovoltaic cell 532 can absorb light vibrating in the first direction from incident light and pass light vibrating in the second direction perpendicular to the first direction. The second photovoltaic cell 534 can absorb the light vibrating in the second direction from the incident light and pass the light vibrating in the first direction.

The incident light absorbed by the first and second photovoltaic cells 532 and 534 can be converted to electric energy. The first and second photovoltaic cells 532 and 534 can charge a battery 444 by supplying the converted electric energy to a power supply circuit 540, which may include a DC-DC converter 442.

According to embodiments, the display panel 520 can be configured with any of a penetration, semi-penetration, or reflection type display device. The penetration type display device and the semi-penetration type display device may require a backlight unit 510, which supplies light to the display panel 520 under the control of the system 550. The backlight unit 510 may be configured with a direct type backlight unit or an edge type backlight unit.

Figure 6A:
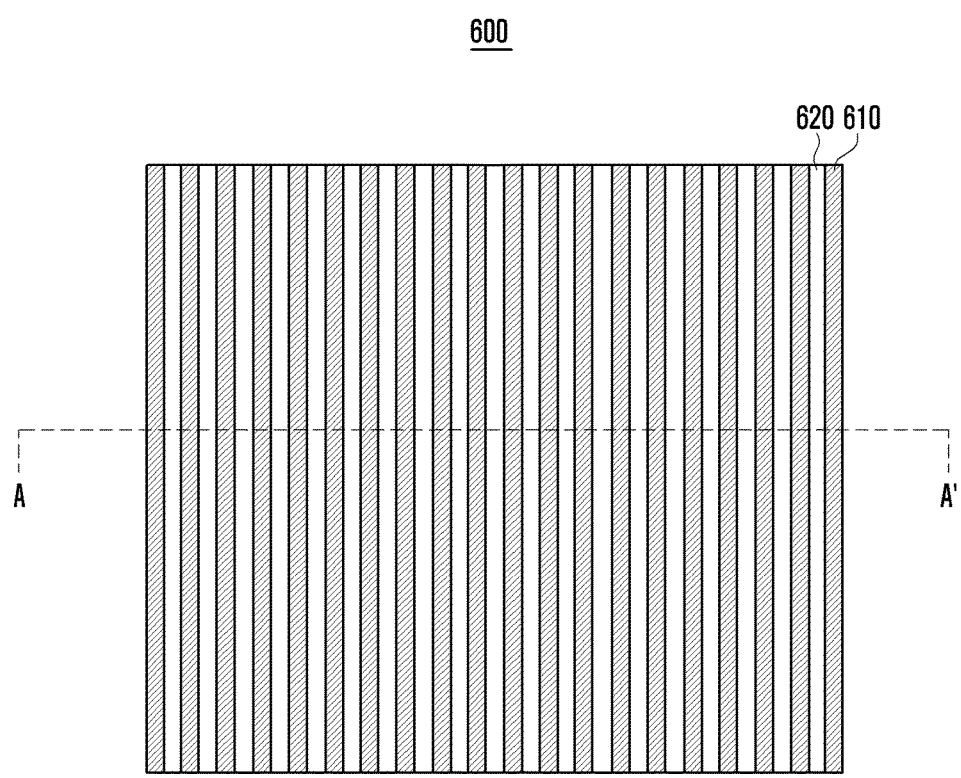
FIGS. 6A and 6B illustrate a photovoltaic cell including a first electrode, a second electrode, and a photovoltaic cell layer, according to embodiments of the present disclosure.
Figure 6B:
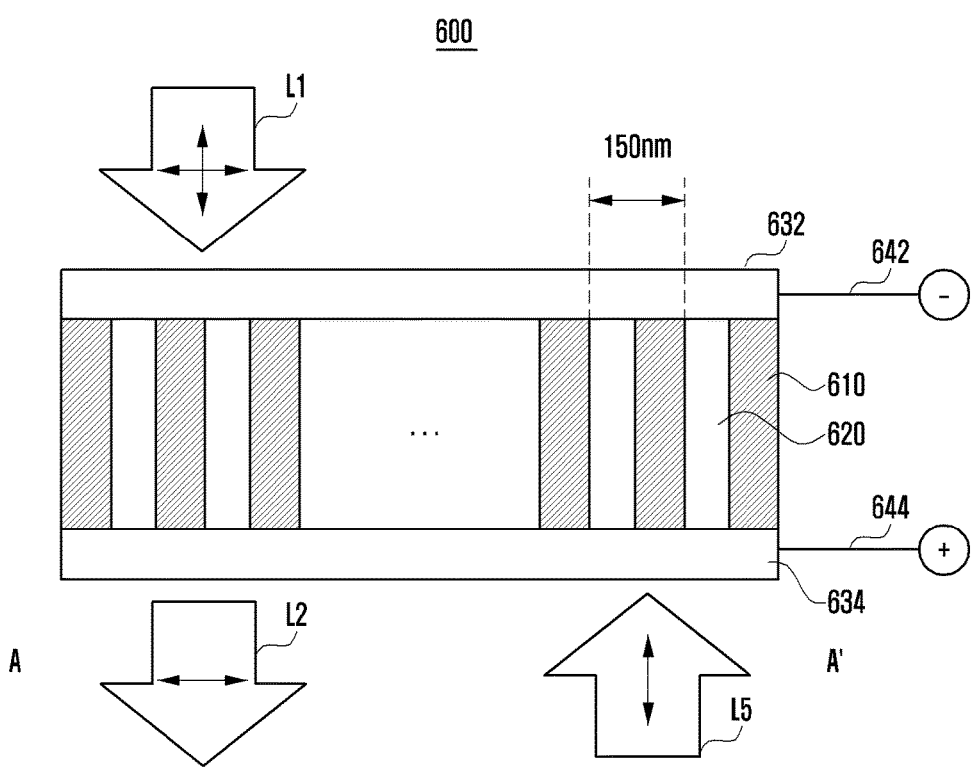

FIGS. 6A and 6B illustrate a schematic structure of a photovoltaic cell 600 according to embodiments of the present disclosure. FIG. 6A is a plan view of the photovoltaic cell 600, and FIG. 6B is a cross-sectional view of the photovoltaic cell 600, which is made by cutting the photovoltaic cell 600 along the line A-A' of FIG. 6A. With reference to FIGS. 6A and 6B, the photovoltaic cell 600 may include a first electrode 632, second electrode 634, and a photovoltaic cell layer including a plurality of unit cells 610 and slits 620 disposed between the first electrode 632 and the second electrode 634.

The first electrode 632 and the second electrode 634 are disposed facing each other, and can be configured with a transparent electrode. A first electrode line 642 is connected to a side of the first electrode 632, and a second electrode line 644 is connected to a side of the second electrode 634. Polarity of the first electrode line 642 and the second electrode line 644 can be changed according to an electromotive force generated by a plurality of unit cells 610. The first electrode line 642 and the second electrode line 644 are connected to the power supply circuits 440 and 540, and can supply electric energy generated by the photovoltaic cell 600 to the power supply circuits 440 and 540.

The photovoltaic cell layer may include a plurality of unit cells 610 arranged in a specific distance and formed in a bar shape, and can be extended in a specific direction (e.g., first direction). The plurality of unit cells 610 can be disposed in a specific distance in a second direction perpendicular to the first direction, and thus can form a plurality of slits 620.

The plurality of slit 620 can be formed with a transparent material, such as a transparent insulator. According to embodiments, the photovoltaic cell 600 can be a polarizer by designing the photovoltaic cell 600 so that a distance between adjacent slits 620 decreases to less than 150 nm. According to an embodiment, the distance between the plurality of slits 620 is not limited to less than 150 nm, and can be modified variously according to polarizing characteristics of the polarizing film.

According to embodiments, an absorption axis of absorbing light and a penetration axis of passing light by the photovoltaic cell 600 can vary according to an arrangement direction of the plurality of unit cells 610 and the plurality of slits 620. As illustrated, the photovoltaic cell 600 absorbs light vibrating in the first direction and passes light vibrating in the second direction perpendicular to the first direction from incident light received from the outside.

The plurality of unit cells 610 is connected to each of the first and second electrodes 632 and 634, and can generate an electromotive force by absorbing the incident light received from the outside. The plurality of unit cells 610 may have a semiconductor layer including at least one p-type semiconductor and at least one n-type semiconductor, and an intrinsic semiconductor between the at least one p-type semiconductor and the at least one n-type semiconductor.

FIGS. 7A, 7B, 7C, 7D and 7E illustrate a cross-sectional structure of a unit cell according to embodiments of the present disclosure.

Figure 7A:
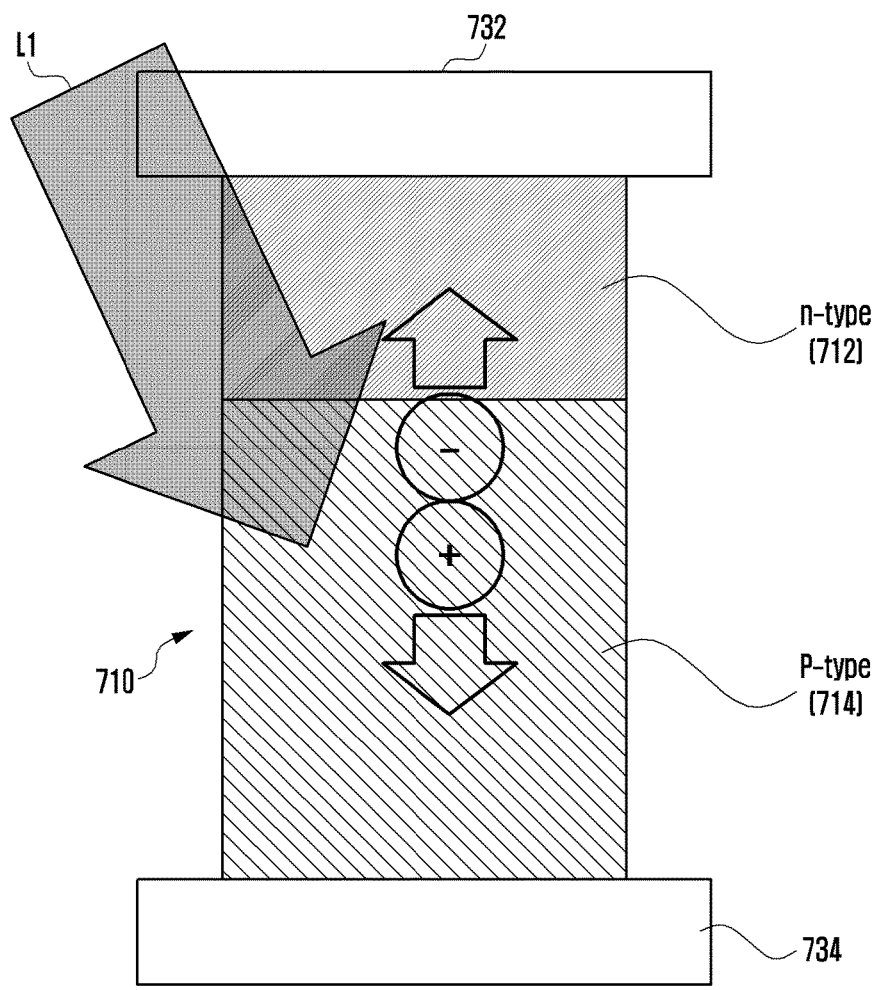
FIGS. 7A, 7B, 7C, 7D and 7E illustrate a cross-sectional structure of a unit cell according to embodiments of the present disclosure.

In FIG. 7A, an operation principal of photovoltaic cell according to embodiments of the present disclosure can be described with an reverse operation of an LED or a laser diode which converts electric energy to light energy. For example, the unit cell may be configured with a p-n junction diode having a large area as shown in FIG. 7A. A plurality of unit cells may be configured with a semiconductor layer 710 including at least one p-type semiconductor 714 and at least one n-type semiconductor 712 disposed between a first electrode 732 and a second electrode 734.

The n-type semiconductor 712 may have a high electron density and a low hole density. The p-type semiconductor 714 may have a high hole density and a low electron density.

In a heat equilibrium state, a diode formed by combining the p-type semiconductor 714 and the n-type semiconductor 712 can generate a charging imbalance because of a gradient dispersion in a carrier concentration. An electric field may be formed according to the charging imbalance, and the carrier dispersion no longer occurs. If light having an energy difference greater than band gap energy between a conduction band and a valance band of a corresponding material is emitted to the diode formed with the p-type semiconductor 714 and the n-type semiconductor 712, electrons can be excited from the valance band to the conduction band by receiving light energy. The electrons excited to the conduction band can move freely, and holes may be generated at the locations of escaped electrons, which may be referred to as an excess carrier. The excess carriers can diffuse according to concentration differences in the conduction and or the valance band.

The electron excited in the p-type semiconductor 714 and the hole generated in the n-type semiconductor 712 may be defined as a minority carrier, and the carrier in the p-type semiconductor 714 or the n-type semiconductor 712 before combining each other may be defined as a majority carrier. The electrons of the majority carriers are interrupted by an energy barrier generated by an electric field, but the electrons of the minority carriers in the p-type semiconductor 714 can move to the n-type semiconductor 712.

According to the diffusion of the minority carrier, charge neutrality in a material collapses, a potential voltage drop is generated, and an electromotive force can be generated at both electrodes of the p-n junction diode. The generated electromotive force can charge the batteries 444 and 544 by connecting to the power supply circuits 440 and 540 through the first electrode line 642 and the second electrode line 644.

Figure 7B:
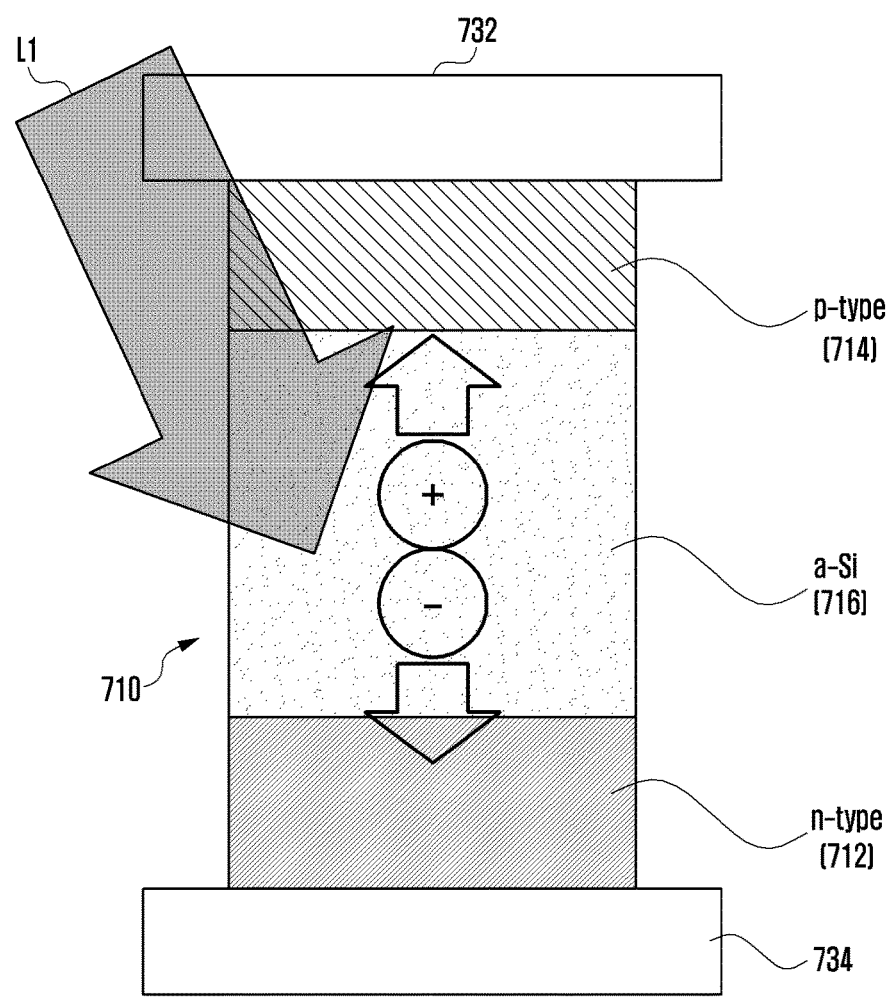
Figure 7C:
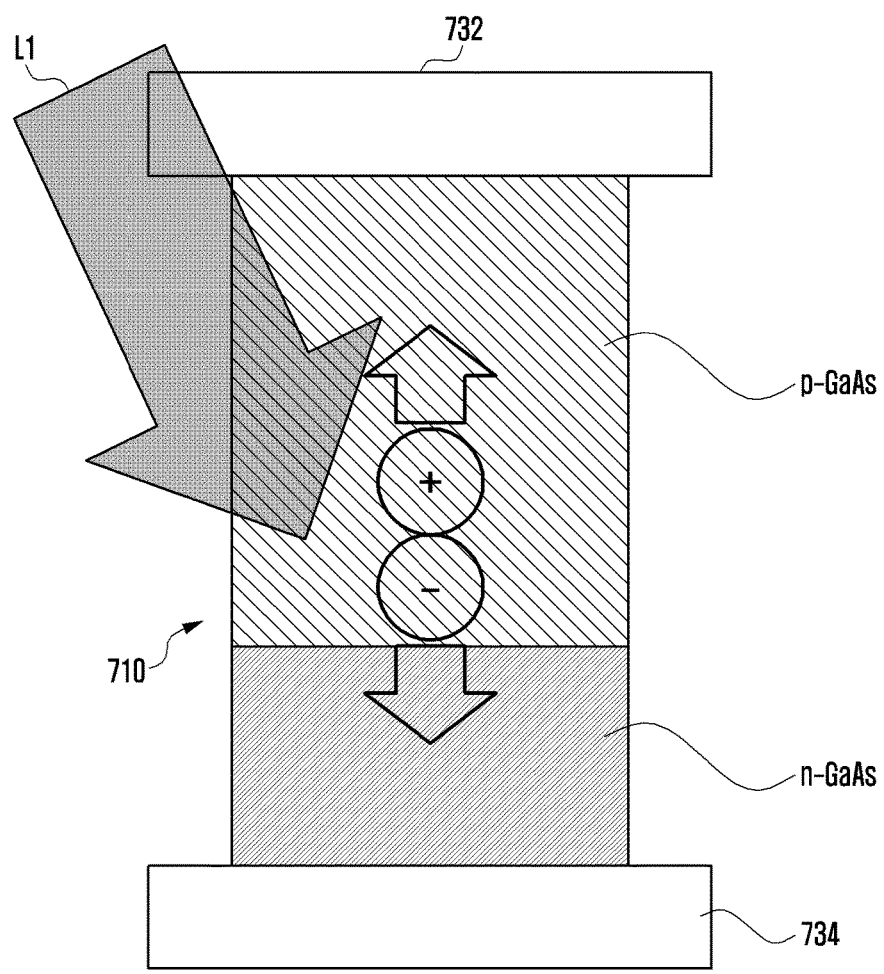
Figure 7D:
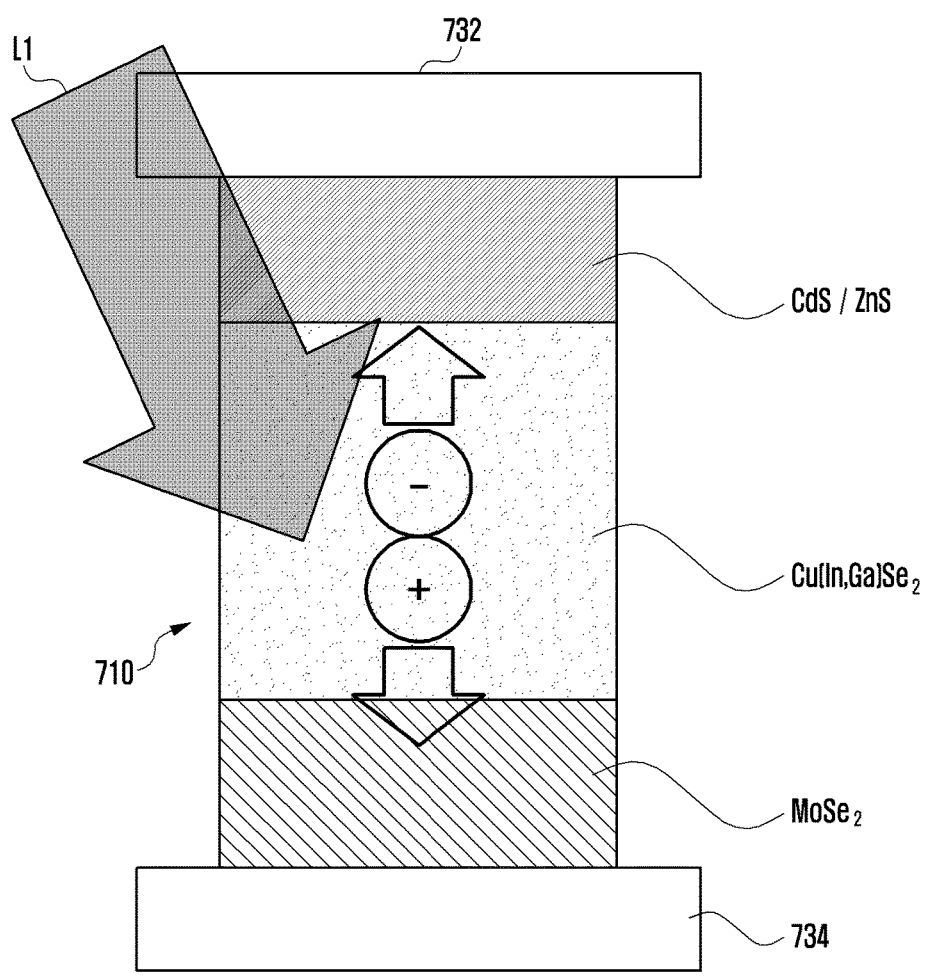
Figure 7E:
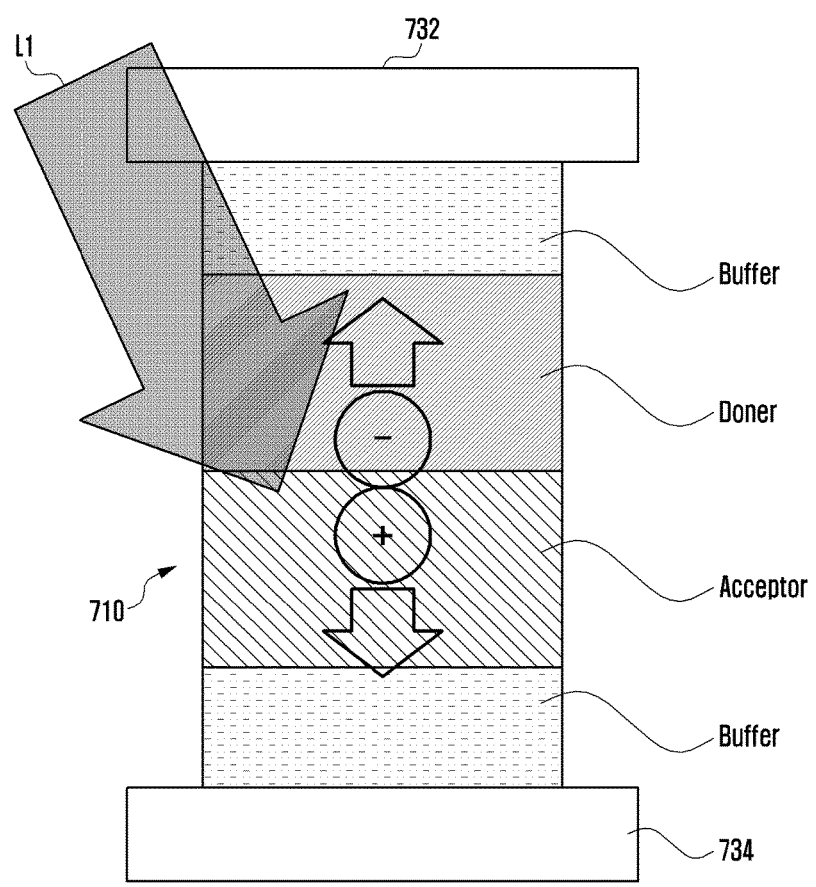

According to embodiments, the photovoltaic cell can be modified in various forms without being limited to the structure illustrated by FIG. 7A. For example, the plurality of unit cells may have a stacked n-type semiconductor 712, amorphous silicon (a-Si) 716, and p-type semiconductor 714 structure as shown in FIG. 7B, a stacked n-gallium arsenic (GaAs) layer and a p-GaAS layer as shown in FIG. 7C and a stacked molybdenum selenide ($MoSe_2$) layer, copper selenide $(Cu(In, Ga)Se_2$ layer, and a cadmium sulfide (CdS) or zinc sulfide (ZnS) layer as shown in FIG. 7D. Alternatively, the plurality of unit cells may have a stacked buffer layer, acceptor layer, donner layer, and buffer layer (i.e., in an organic photovoltaic cell form) as shown in FIG. 7E. The photovoltaic cell can also be configured by using a dye sensitized solar cell, perovskite material, or quantum dot.

Figure 8:
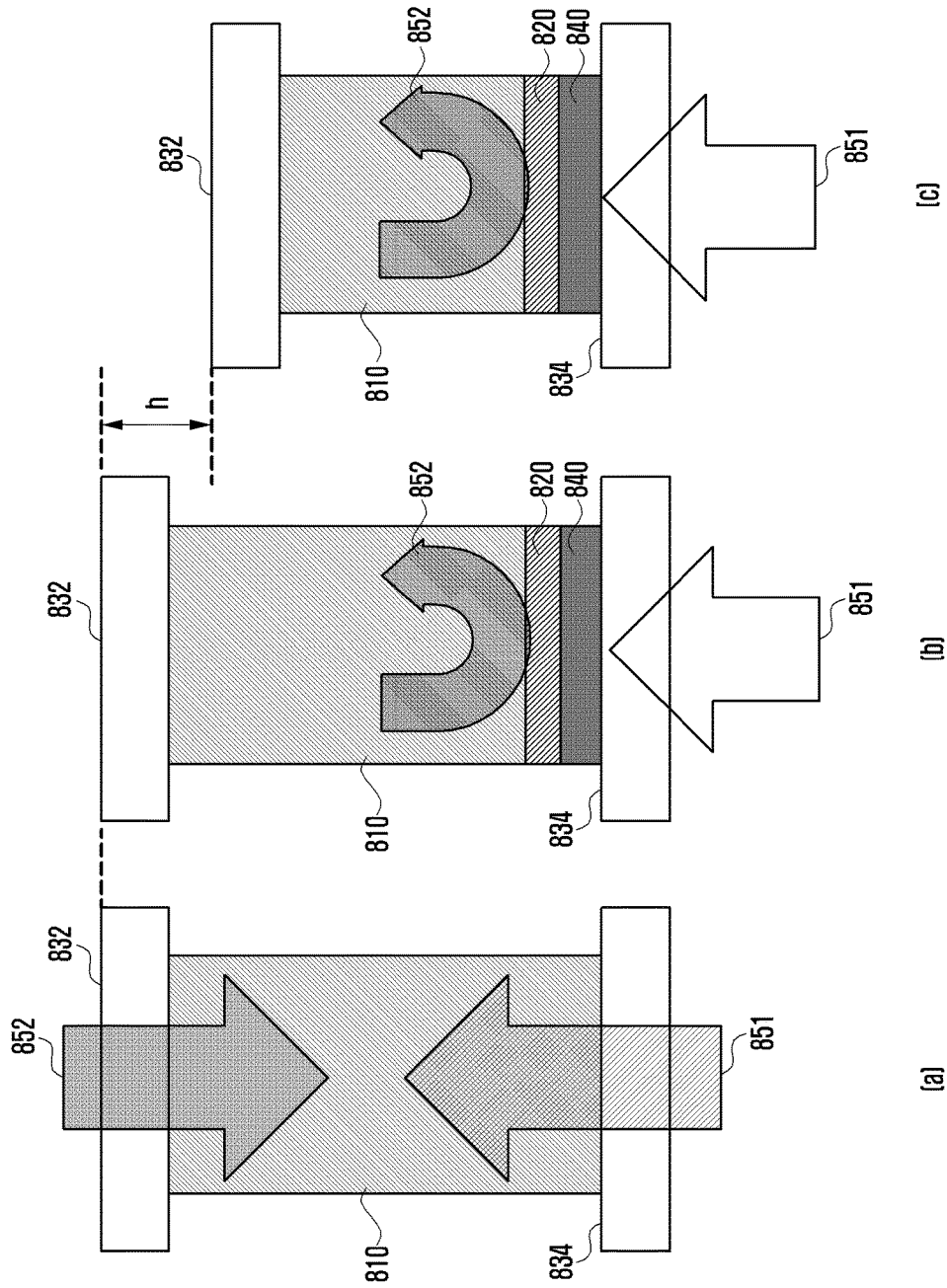
FIG. 8 illustrates an example of a modified cross-sectional structure of a unit cell according to embodiments of the present disclosure.

FIG. 8 illustrates an example of a modified cross-sectional structure of a unit cell according to embodiments of the present disclosure.

In section (a) of FIG. 8, a plurality of unit cells can be configured only with a semiconductor layer 810 disposed between a first electrode 832 and a second electrode 834. An amount of light absorbed by the semiconductor layer 810 may be proportional to an amount of electric energy produced by the photovoltaic cell 600. In the semiconductor layer 810, the height of a unit cell (i.e., height of semiconductor layer 810) may be designed properly for efficient light absorption. For example, if the height of semiconductor layer 810 increases, a volume of absorbing light and an electric power production efficiency may increase, but if the height of semiconductor layer 810 exceeds a predetermined value, the electric power production efficiency can decrease because the movement distance of electrons and holes are increased.

In order to solve the above problems, the photovoltaic cell 600 according to embodiments may further include a metal layer 820 in addition to the semiconductor layer 810. In section (b) of FIG. 8, the plurality of unit cells may include a light shielding layer 840 disposed on a second electrode 834, a metal layer 820 disposed on the light shielding layer 840, and a semiconductor layer 810 disposed on the metal layer 820. The metal layer 820, which may be formed with a light reflecting material, can reduce an electric resistance of a first electrode 832 or a second electrode 834, and improve an electric power production efficiency by enabling the semiconductor layer 810 to more easily move electrons and holes.

The photovoltaic cell 600 according to an embodiment can improve the electric power production efficiency by forming the metal layer 820 with a light reflecting material so that the semiconductor layer 810 absorbs incident light in 2 instances. For example, if light 852 enters the front surface of the photovoltaic cell 600, a part of the light 852 may be absorbed by the semiconductor layer 810 and the remaining amount of the light 852 may be reflected by the metal layer 820 and then re-absorbed by the semiconductor layer 810.

According to an embodiment, the light shielding layer 840 can be formed with a light absorbing conductive material such as carbon nano tube (CNT). The light shielding layer 840 can prevent light 851 entering the rear surface (i.e., lower part) of the photovoltaic cell 600 from being reflected by the metal layer 820. For example, the light shielding layer 840 can prevent deterioration of outdoor visibility and black degradation by preventing the incident light entering through the lower part of the photovoltaic cell 600 (i.e., light entering the photovoltaic cell 600 after being reflected by the display panel 410; L5 of FIG. 4) from being further reflected by the metal layer 820.

In section (c) of FIG. 8, if a metal layer 820 is included in the photovoltaic cell 600, the total height of the photovoltaic cell 600 can be reduced. For example, the photovoltaic cell 600 including the metal layer 820 can absorb the incident light in two instances and the electric power production efficiency can be increased as described above. Accordingly, the height (thickness) of the photovoltaic cell 600 can be reduced by designing the semiconductor layer 810 with a limited thickness. As illustrated, the height of the unit cell in section (c) of FIG. 8 is reduced by height h compared to the heights of unit cells in sections (a) and (b) of FIG. 8.

Figure 9A:
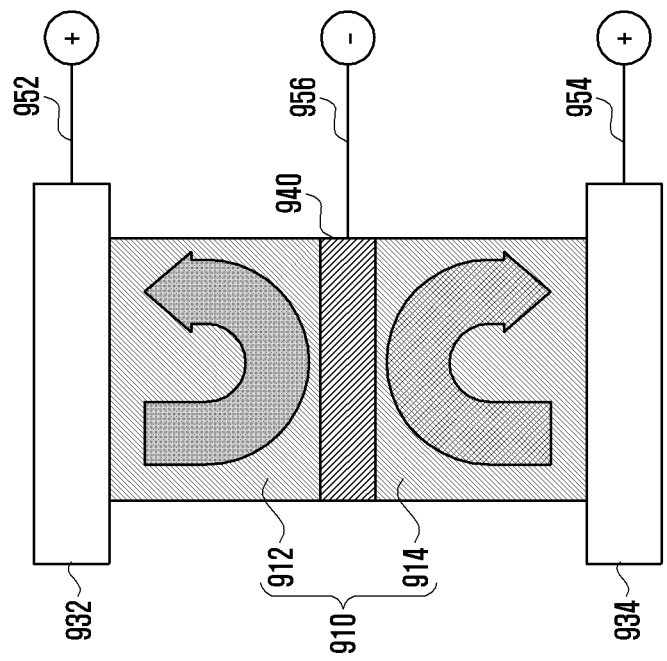
FIGS. 9A and 9B illustrate another example of a modified cross-sectional structure of a unit cell according to embodiments of the present disclosure.
Figure 9B:
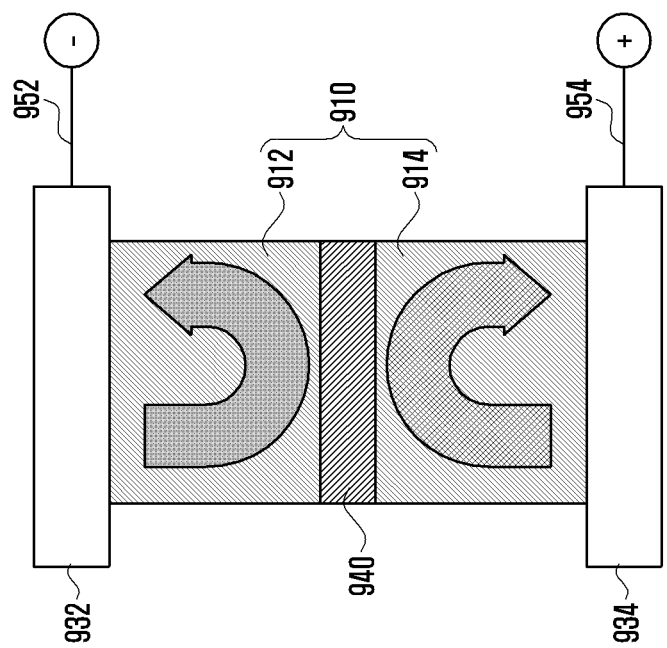
Figure 10B:
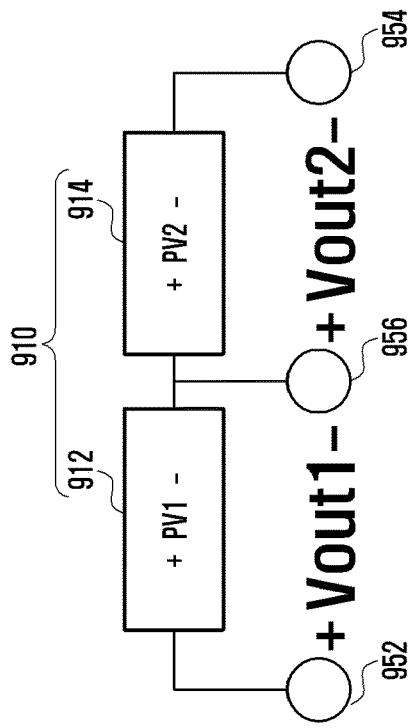
FIGS. 10A and 10B illustrate an equivalent circuit of a unit cell according to embodiments of the present disclosure.
Figure 10A:
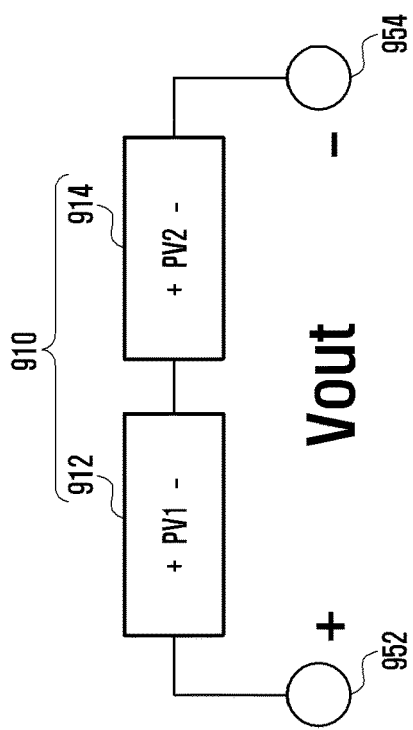
Figure 11:
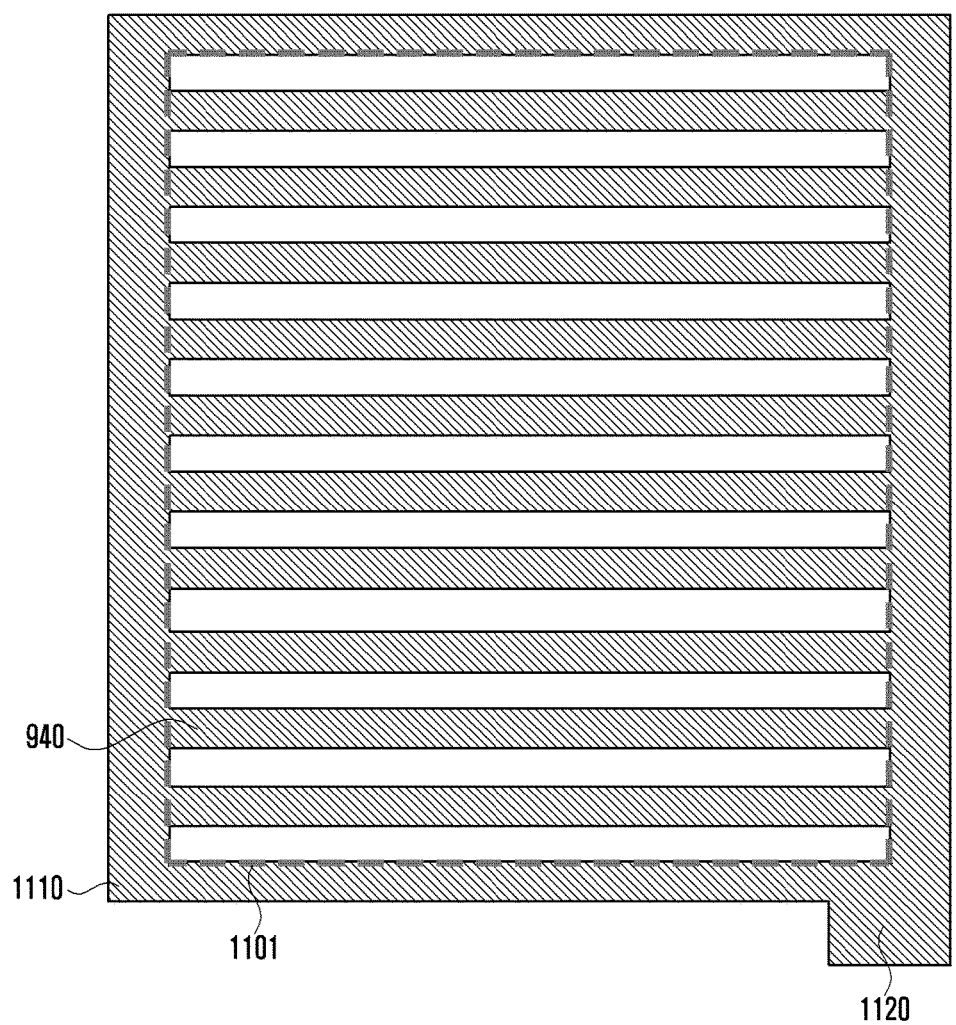
FIG. 11 illustrates an example of a schematic plan structure of a metal layer according to embodiments of the present disclosure.

FIGS. 9A and 9B illustrate another example of a modified cross-sectional structure of a unit cell, FIGS. 10A and 10B illustrate an equivalent circuit of a unit cell according to embodiments of the present disclosure, and FIG. 11 illustrates a schematic plan structure of a metal layer according to embodiments of the present disclosure.

In FIGS. 9A and 9B, each of the plurality of unit cells may include a plurality of semiconductor layers 910. For example, the plurality of semiconductor layers 910 may include a first semiconductor layer 912 and a second semiconductor layer 914 stacked by inserting a metal layer 940 between the first and second semiconductor layers 912 and 914. According to an embodiment, the first semiconductor layer 912 is connected to a first electrode 932 and may include at least one p-type semiconductor and at least one n-type semiconductor. The second semiconductor layer 914 is connected to a second electrode 934 and may include at least one p-type semiconductor and at least one n-type semiconductor. A metal layer 940 may be disposed between the first semiconductor layer 912 and the second semiconductor layer 914, and the first semiconductor layer 912 may be disposed above the second semiconductor layer 914. A first electrode line 952 is connected to the first electrode 932, and a second electrode line 954 is connected to the second electrode 934.

The metal layer 940, which may be formed with a light reflecting material, can improve an electric power production efficiency by enabling electrons and holes to move easily in the semiconductor layer. The first semiconductor layer 912 can produce electric energy by absorbing an incident light entering the front surface (i.e., upper part) of the photovoltaic cell and a light reflected by the metal layer 940. The second semiconductor layer 914 can produce electric energy by absorbing light entering the rear surface (i.e., lower part) of the photovoltaic cell and light reflected by the metal layer 940.

According to embodiments, the first semiconductor layer 912 and the second semiconductor layer 914 can be connected in series or parallel according to the structure of the metal layer 940. For example, the metal layer 940 in the plurality of unit cells can float electrically, in which case the first semiconductor layer 912 and the second semiconductor layer 914 are connected in series, and the photovoltaic cell can produce electric energy having a relatively high voltage level, as shown in FIG. 10A. For example, a voltage difference Vout between both ends of the first and second electrode lines 952 and 954 shown in FIG. 10A may be greater than a voltage difference Vout1 between both ends of the first and third electrode lines 952 and 956 and a voltage difference Vout2 between both ends of the second and third electrode lines 954 and 956 shown in FIG. 10B.

According to another embodiment, the metal layers 940 included in the plurality of unit cells can be connected to each other in a boundary area shown in FIG. 11. For example, the metal layer 940 included in the plurality of unit cells can be connected to each other in the boundary area of the first electrode 932 and the second electrode 934, as formed in a display area 1101 of a display panel. According to an embodiment, the photovoltaic cell 600 may include a connector 1110 for connecting the metal layers 940 in the boundary area and a pad 1120 extended outwards from an end of the boundary area. The pad 1120 connects the first semiconductor layer 912 and the second semiconductor layer 914 in parallel, and can be connected to a third electrode line 956 illustrated in FIG. 10B, and connected with the power supply circuits 440 and 540. The connector 1110 and pad 1120 are formed with the same material of the metal layer 940, and can be simultaneously formed together with the metal layer 940. If the metal layers 940 are connected to each other, the first semiconductor layer 912 and the second semiconductor layer 914 are connected to each other in parallel as shown in FIG. 10B, and the photovoltaic cell 600 can produce electric energy having a relatively stable voltage level.

Figure 12A:
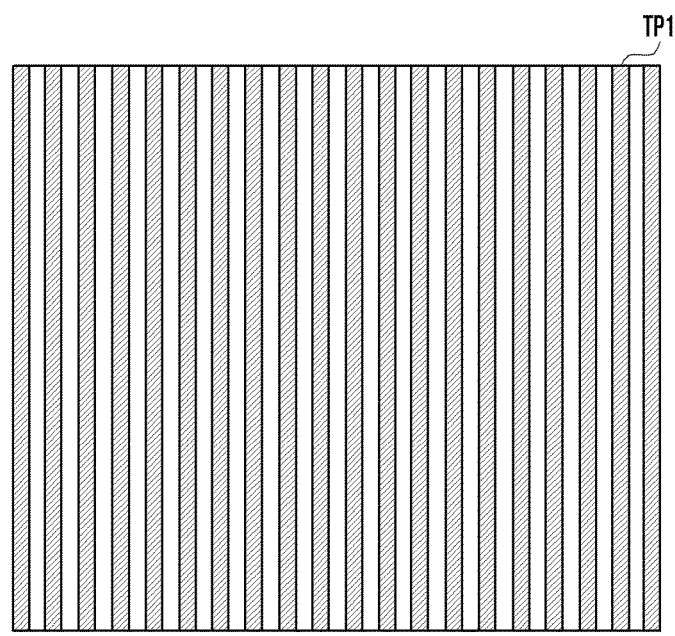
FIGS. 12A, 12B and 12C illustrate an arrangement of a plurality of unit cells having different structures, according to embodiments of the present disclosure.
Figure 12B:
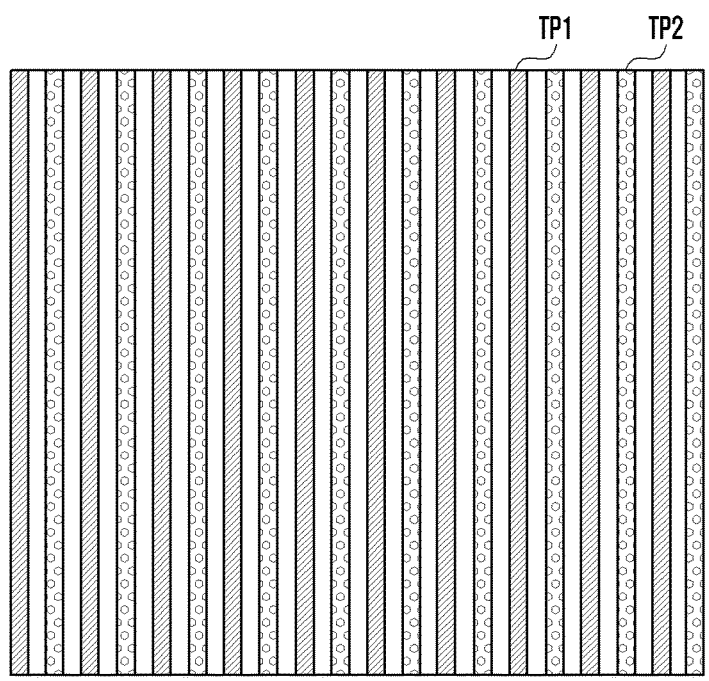
Figure 12C:
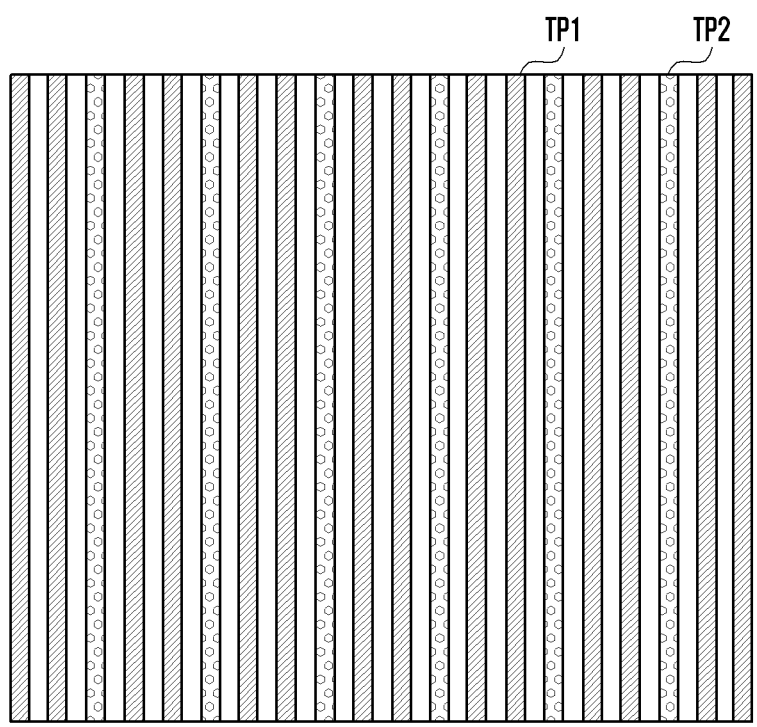

FIGS. 12A, 12B and 12C illustrate an arrangement of a plurality of unit cells having different structures according to embodiments of the present disclosure.

As shown in FIGS. 8 and 9, if the metal layers 820 and 940 are included, a light penetration rate of the photovoltaic cell can be relatively decreased. The photovoltaic cell according to embodiments can improve the light penetration rate by complexly arranging unit cells having the metal layers 820 and 940 and unit cells not having the metal layers 820 and 940. For example, a unit cell configured only with the semiconductor layers 810 and 910 without including the metal layers 820 and 940 may be defined as a first unit cell TP1, illustrated in FIG. 12A, and a unit cell including the metal layers 820 and 940 as well as the semiconductor layers 810 and 910 may be defined as a second unit cell TP2 as shown by FIGS. 8, 9 and 12B.

According to an embodiment, the photovoltaic cell may include only the plurality of first unit cells TP1, and may be arranged with the plurality of first unit cells TP1 maintaining specific distances as shown in FIG. 12A. According to another embodiment, the photovoltaic cell may include a plurality of first unit cells TP1 and a plurality of second unit cells TP2, and the first and second unit cells TP1 and TP2 can be alternately arranged as shown in FIG. 12B. Alternatively, the photovoltaic cell may include a plurality of first unit cells TP1 and a plurality of second unit cells TP2, and the number of the plurality of first unit cells TP1 may be greater than or equal to the number of the plurality of second unit cells TP2 as shown in FIG. 12C. For example, at least two first unit cells TP1 can be arranged between adjacent second unit cells TP2. The photovoltaic cell according to embodiments can improve a light penetration ratio and a brightness of a display by arranging a greater number of the first unit cells TP1 than the second unit cells TP2.

Figure 13A:
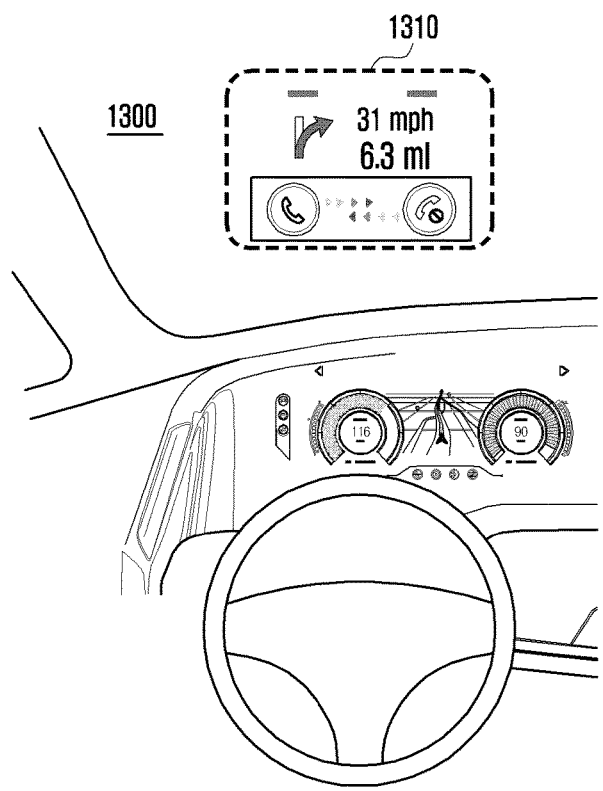
FIGS. 13A and 13B illustrate examples of using a photovoltaic cell according to embodiments of the present disclosure.
Figure 13B:
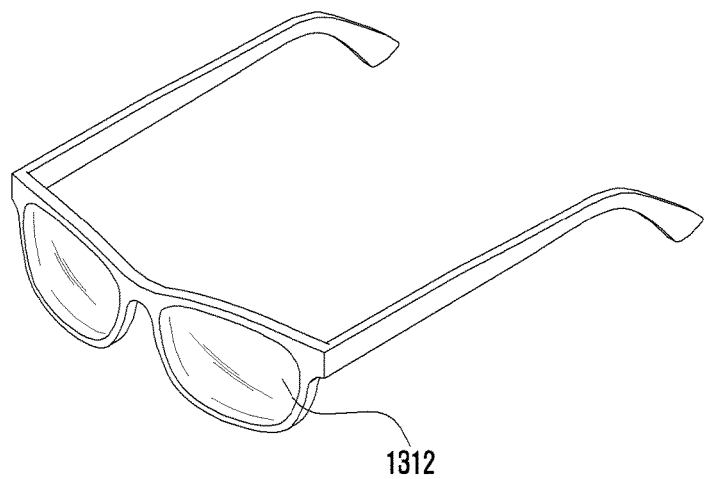

FIGS. 13A and 13B illustrate examples of using a photovoltaic cell according to embodiments of the present disclosure.

The photovoltaic cell 600 according to embodiments of the present disclosure can be applied to various electronic devices and machines, and to an industrial field using a polarizing board or a polarizing film. By replacing the role of the polarizing board or the polarizing film, electric energy can be produced by absorbing light, and the role of polarizing light can be simultaneously performed.

In FIG. 13A, the photovoltaic cell 600 according to embodiments can be applied to an automobile system. Recently, a head up display (HUD) 1310 has been used to display navigation or driving-related information on a windshield 1300 of an automobile. By applying the photovoltaic cell 600 to the windshield 1300, electric energy can be produced by absorbing sunlight, and the visibility of the head up display 1310 can simultaneously be improved by a polarizing effect of the photovoltaic cell 600.

According to another embodiment, the photovoltaic cell 600 can be applied to electronic eyeglasses 1312 having a polarizing function as shown in FIG. 13B. By doing so, electric energy can be produced from the sunlight and a polarizing effect can simultaneously be obtained. The electronic eyeglasses 1312 may be polarizing eyeglasses for watching three dimensional (3D) images or an HMD.

The photovoltaic cell 600 according to embodiments of the present disclosure can be applied to at least one of an automobile, smartphone, tablet PC, mobile phone, image phone, electronic book reader, desktop PC, laptop PC, netbook computer, workstation, server, PDA, portable multimedia player (PMP), motion pictures experts group (MPEG) layer audio 3 (MP3) player, medical equipment, camera, and wearable device.

FIGS. 14A, 14B, 14C and 14D illustrate a configuration of an electronic device including a photovoltaic cell and a path of supplying energy generated by the photovoltaic cell according to embodiments of the present disclosure.

In FIGS. 14A, 14B, 14C and 14D, the electronic device may include a photovoltaic cell module (PV module) 1410 configured with a photovoltaic cell, battery 1450, charging IC 1440 for charging the battery 1450, charging adaptor 1420 connected to the charging IC 1440, wireless charger 1430, wireless charging IC 1440 connected to the wireless charger 1430, PMIC 1460, system 1470, an electrostatic protection circuit or ground 1482 connected to the photovoltaic cell module 1410, and a heat dissipation sheet or a heat sink 1483.

The photovoltaic cell module 1410 can prevent electrostatic induced from the outside. At least one part of the photovoltaic cell module 1410 can prevent a breakdown or damage of the electronic device by transmitting the induced electrostatic to the electrostatic protection circuit or the ground 1482.

According to embodiments, at least one part of the photovoltaic cell module 1410 can be connected to a heat dissipation sheet or a heat sink 1483 to improve the reliability of the electronic device, since heat can be generated while electric energy is generated.

Hereinafter, a path of supplying electric energy produced by the photovoltaic cell module 1410 (i.e., path of charging the battery 1450) will be described.

Figure 14A:
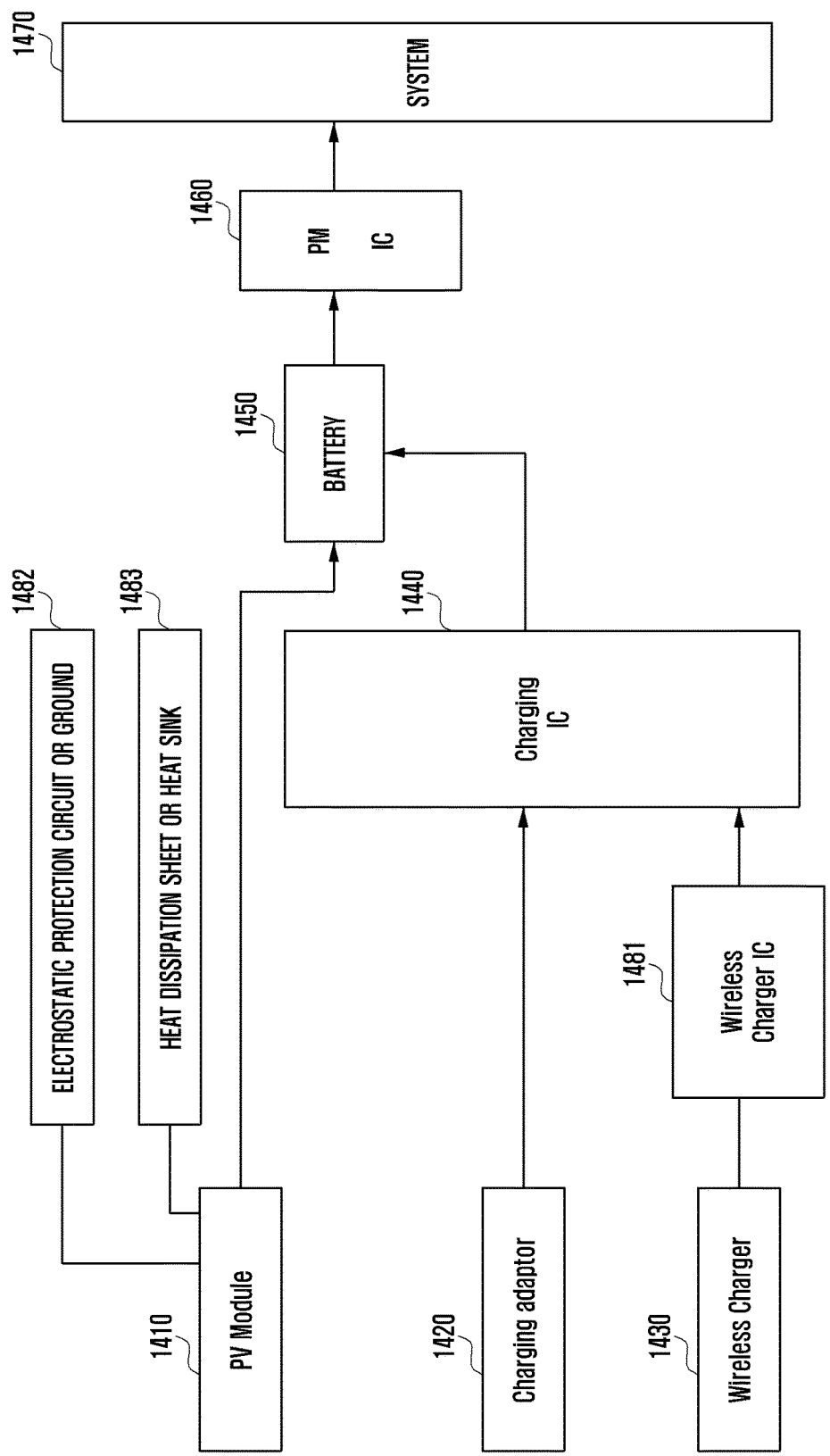
FIGS. 14A, 14B, 14C and 14D illustrate a configuration of an electronic device including a photovoltaic cell and a path of supplying energy generated by the photovoltaic cell according to embodiments of the present disclosure.
Figure 14B:
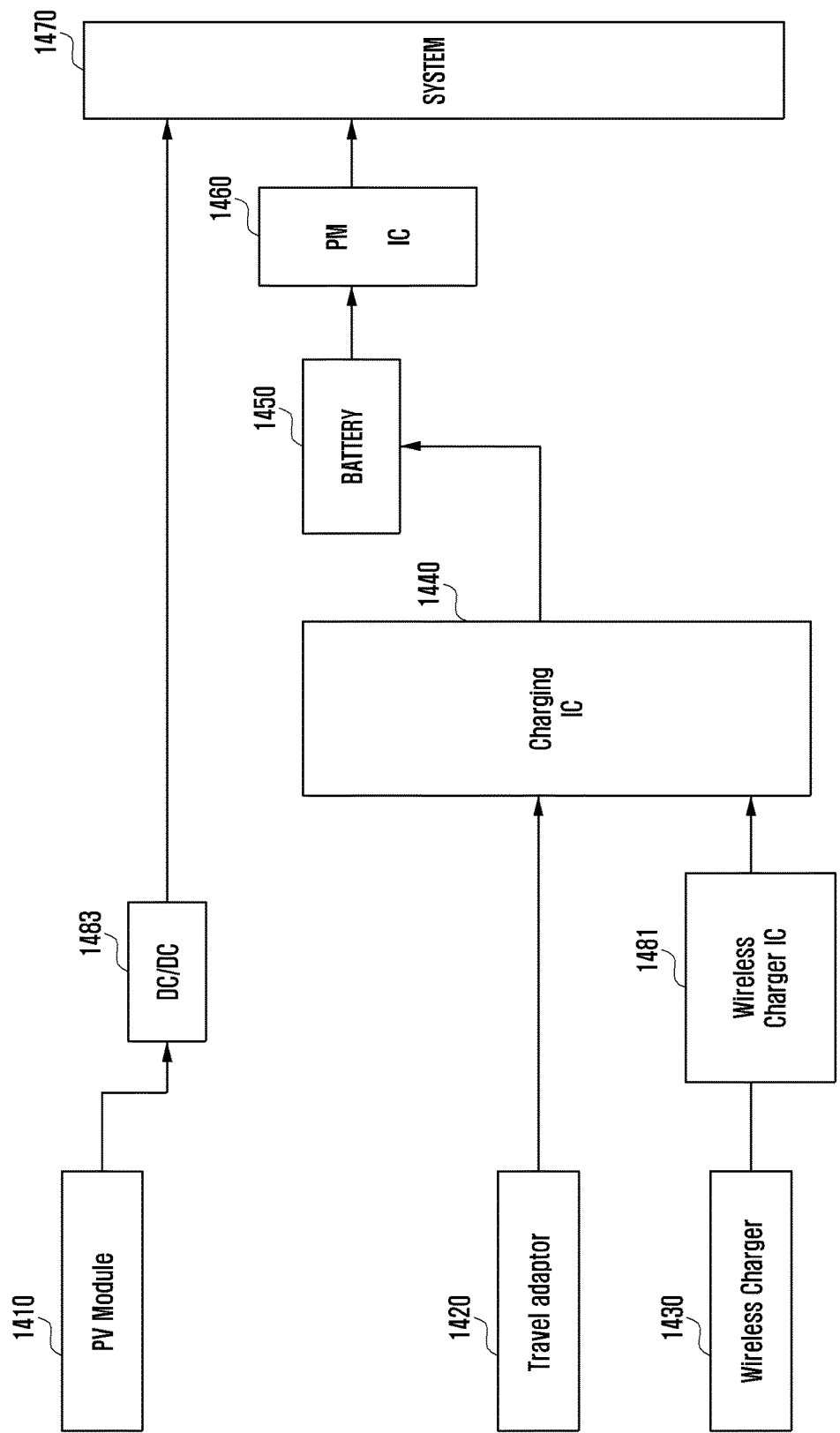
Figure 14C:
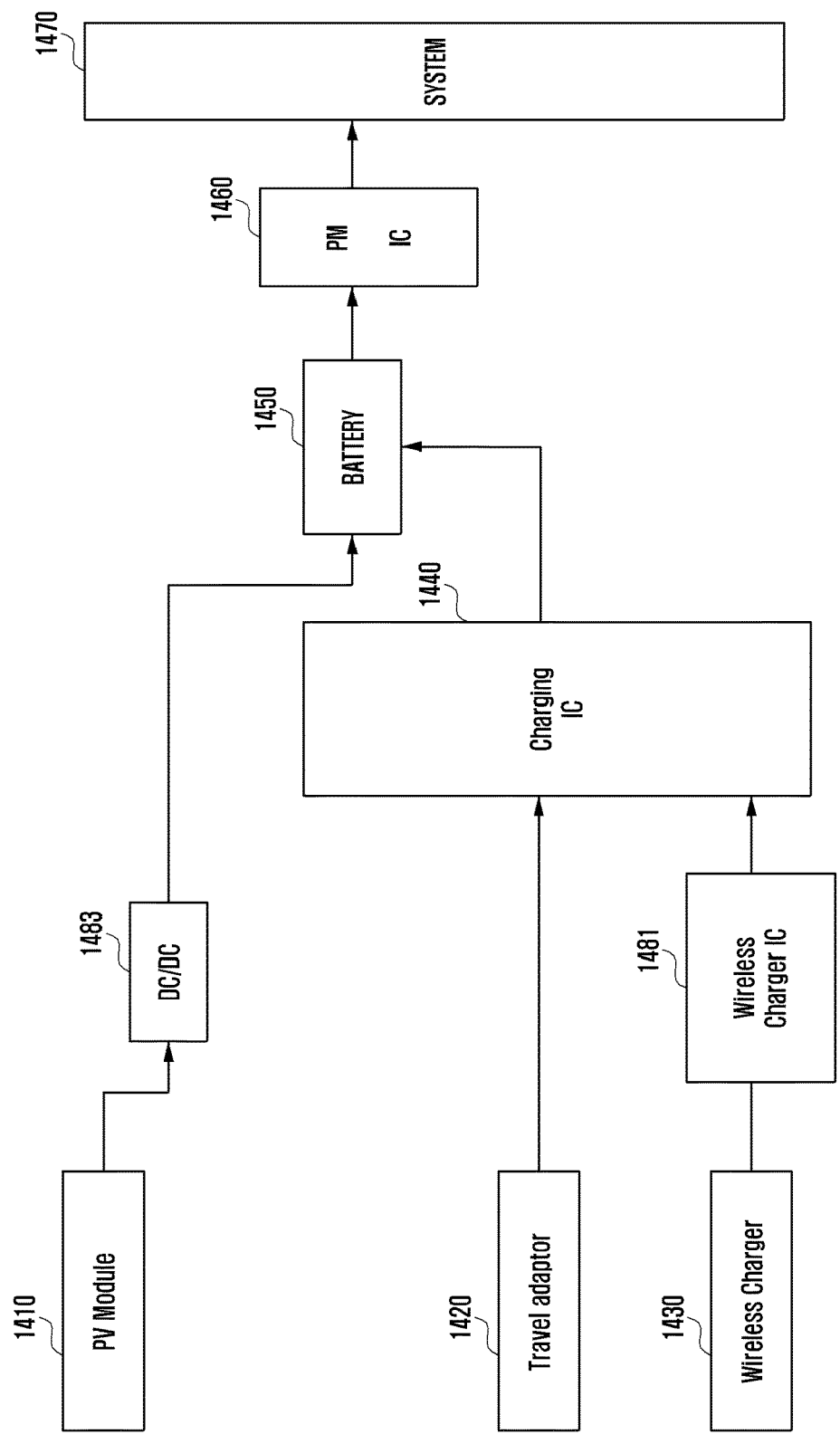
Figure 14D:
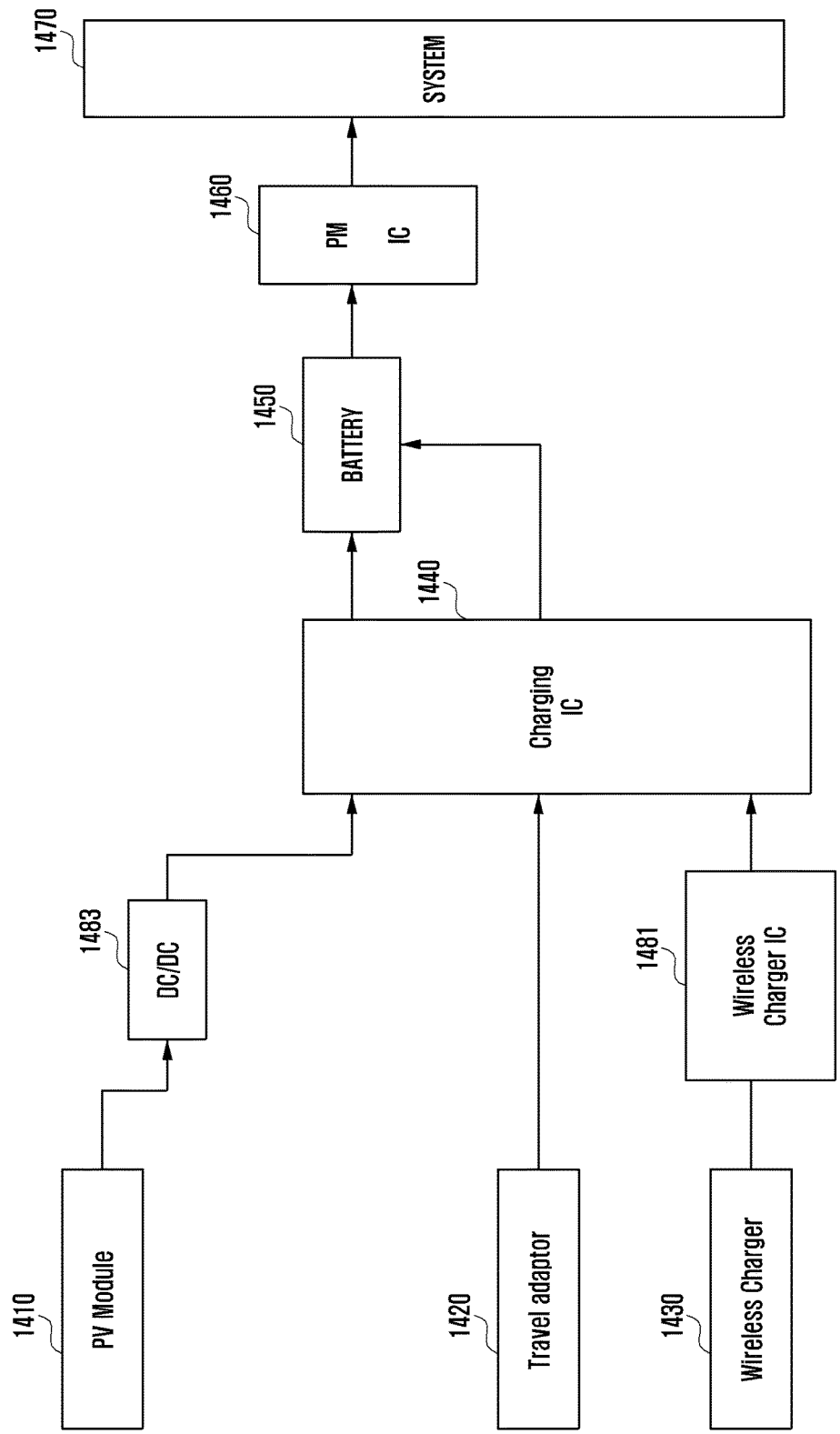

In FIG. 14A, the electric energy produced by the photovoltaic cell module 1410 can be supplied directly to the battery 1450, or to a DC-DC converter 1483 as shown in FIG. 14B, in which the DC-DC converter 1483 can convert the electric energy received from the photovoltaic cell module 1410 to electric current having a specific level, and supply the converted electric current to the system 1470. Alternatively, the electric energy produced by the photovoltaic cell module 1410 can be supplied to the DC-DC converter 1483 as shown in FIG. 14C, wherein the DC-DC converter 1483 can convert the electric energy received from the photovoltaic cell module 1410 to an electric current having a specific level, and supply the converted electric current to the battery 1450. Alternatively, the electric current produced by the photovoltaic cell module 1410 can be supplied to the DC-DC converter 1483 as shown in FIG. 14D, wherein the DC-DC converter 1483 can convert the electric energy received from the photovoltaic cell module 1410 to an electric current having a specific level, and supply the converted electric current to the charging IC 1440. The charging IC 1440 can charge the battery 1450 by using the electric current received from the DC-DC converter 1483.

As described above, the photovoltaic cell according to embodiments of the present disclosure can be used as an electric power source for an electronic device and heat generation of the electronic device can be reduced. The photovoltaic cell produces electric energy by using incident light, and extends the hours of use for a battery and an electronic device. The brightness and image quality can be maintained in the same level as the conventional technology by replacing a polarizing film configured in the electronic device with a new film disclosed by embodiments of the present disclosure, and light blocked by a polarizing film in a polarizing process can be recycled without dissipating heat.

A programming module according to embodiments of the present disclosure may include one or more of the aforementioned components or may further include additional components, or some of the aforementioned components may be omitted. Operations executed by a module, a programming module, or other component elements according to embodiments of the present disclosure may be executed sequentially, in parallel, repeatedly, or in a heuristic manner. Some operations may be executed according to another order or may be omitted, or other operations may be added.

While the present disclosure has been described with reference to certain embodiments thereof, it will be understood by those skilled in the art that various changes in form and detail may be made therein without departing from the spirit and scope of the present disclosure as defined by the appended claims and their equivalents.

What is claimed is:

1. A photovoltaic cell comprising:
a first electrode and a second electrode having transparency and disposed facing each other; and
a photovoltaic cell layer disposed between the first and second electrodes, and configured to produce electric energy by absorbing a part of incident light,
wherein the photovoltaic cell layer comprises:
a plurality of unit cells disposed in a specific distance from each other and formed with a plurality of slits for polarizing the incident light; and
a transparent insulator disposed in the plurality of slits.

2. The photovoltaic cell of claim 1,
wherein the photovoltaic cell layer is configured to absorb the incident light vibrating in a first direction and to pass the incident light vibrating in a second direction perpendicular to the first direction, and
wherein the plurality of unit cells generates an electromotive force by absorbing the light vibrating in the first direction.

3. The photovoltaic cell of claim 2, wherein each of the plurality of unit cells comprises a semiconductor layer including at least one p-type semiconductor and at least one n-type semiconductor.

4. The photovoltaic cell of claim 3, wherein the semiconductor layer further comprises an intrinsic semiconductor between the at least one p-type semiconductor and the at least one n-type semiconductor.

5. The photovoltaic cell of claim 3, wherein each of the plurality of unit cells further comprises:
a light shielding layer disposed on the second electrode; and
a metal layer disposed between the semiconductor layer and the light shielding layer.

6. The photovoltaic cell of claim 5, wherein the plurality of unit cells comprises a plurality of first unit cells configured with the semiconductor layer, the semiconductor layer, and the metal layer, and
wherein a number of the plurality of first unit cells is greater than or equal to a number of a plurality of second unit cells.

7. The photovoltaic cell of claim 6, wherein at least two first unit cells are disposed between adjacent second unit cells.

8. The photovoltaic cell of claim 2, wherein each of the plurality of unit cells comprises:
a first semiconductor layer connected to the first electrode and including at least one p-type semiconductor and at least one n-type semiconductor,
a second semiconductor layer connected to the second electrode, and including at least one p-type semiconductor and at least one n-type semiconductor, and
a metal layer disposed between the first and second semiconductor layers.

9. The photovoltaic cell of claim 8, wherein the metal layers included in the plurality of unit cells are connected at a boundary area of the first and second electrodes.

10. The photovoltaic cell of claim 8, wherein the metal layers included in the plurality of unit cells are electrically floated.

11. The photovoltaic cell of claim 1, further comprising:
a phase delay layer configured to delay a phase of light polarized by the photovoltaic cell layer.

12. An electronic device comprising:
a battery;
a display panel;
a photovoltaic cell disposed on at least one side of the display panel;
a direct current to direct current (DC-DC) converter configured to convert electric energy produced by the photovoltaic cell to a direct current power source; and
a charging circuit configured to charge the battery by using the direct current power source converted by the DC-DC converter, wherein the photovoltaic cell comprises:
a first electrode and a second electrode having a transparency and disposed facing each other; and
a photovoltaic cell layer disposed between the first and second electrodes, and configured to produce electric energy by absorbing a part of incident light, and
wherein the photovoltaic cell layer comprises:
a plurality of unit cells disposed in a specific distance from each other and formed with a plurality of slits for polarizing the incident light; and
a transparent insulator disposed in the plurality of slits.

13. The electronic device of claim 12, further comprising:
an electrostatic protection circuit and a ground,
wherein at least one part of the photovoltaic cell is connected to the electrostatic protection circuit or the ground.

14. The electronic device of claim 12, further comprising:
a heat dissipation sheet,
wherein at least one part of the photovoltaic cell is connected to the heat dissipation sheet.

15. The electronic device of claim 12, wherein the display panel is configured with an organic light emitting diode panel or a liquid crystal display panel.

16. The electronic device of claim 12, wherein the photovoltaic cell layer is configured to absorb incident light vibrating in a first direction and to pass incident light vibrating in a second direction perpendicular to the first direction, and
wherein the plurality of unit cells generates an electromotive force by absorbing the light vibrating in the first direction.

17. The electronic device of claim 16, wherein each of the plurality of unit cells comprises a semiconductor layer including at least one p-type semiconductor and at least one n-type semiconductor.

18. The electronic device of claim 17, wherein the semiconductor layer further comprises an intrinsic semiconductor between the at least one p-type semiconductor and the at least one n-type semiconductor.

19. The electronic device of claim 17, wherein each of the plurality of unit cells further comprises:

a light shielding layer disposed on the second electrode; and a metal layer disposed between the semiconductor layer and the light shielding layer.

20. The electronic device of claim 19, wherein the plurality of unit cells comprises a plurality of first unit cells configured with the semiconductor layer, the semiconductor layer, and the metal layer, and wherein a number of the plurality of first unit cells is greater than or equal to a number of a plurality of second unit cells.

* * * * *